(12) United States Patent
Sasaki et al.

(10) Patent No.: US 7,358,511 B2
(45) Date of Patent: Apr. 15, 2008

(54) PLASMA DOPING METHOD AND PLASMA DOPING APPARATUS

(75) Inventors: Yuichiro Sasaki, Tokyo (JP); Katsumi Okashita, Osaka (JP); Hiroyuki Ito, Chiba (JP); Bunji Mizuno, Nara (JP); Tomohiro Okumura, Osaka (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 0 days.

(21) Appl. No.: 11/748,607

(22) Filed: May 15, 2007

(65) Prior Publication Data

US 2008/0067439 A1 Mar. 20, 2008

Related U.S. Application Data

(63) Continuation of application No. 11/647,235, filed on Dec. 29, 2006.

(30) Foreign Application Priority Data

May 12, 2005 (JP) .............................. 2005-140405
May 11, 2006 (WO) ................. PCT/JP2006/009509

(51) Int. Cl.
*H01J 37/08* (2006.01)
*G21K 5/10* (2006.01)
(52) U.S. Cl. ................. 250/492.21; 438/510; 438/513; 438/517; 204/192.15
(58) Field of Classification Search .......... 250/492.21; 438/510, 513, 517; 204/192.13, 192.15
See application file for complete search history.

(56) References Cited

U.S. PATENT DOCUMENTS 4,912,065 A 3/1990 Mizuno et al.

4,937,205 A 6/1990 Nakayama et al.

(Continued)

FOREIGN PATENT DOCUMENTS

JP 63-30727 11/1994

(Continued)

OTHER PUBLICATIONS

Jones, E. C., Cheung, N.W., "Plasma Doping Dosimetry", IEEE Transactions on Plasma Science, vol. 25, No. 1, Feb. 1997, pp. 42-52.

(Continued)

*Primary Examiner*—David A. Vanore
(74) *Attorney, Agent, or Firm*—McDermott Will & Emery LLP

(57) ABSTRACT

A plasma doping method, even though a plasma doping treatment is repeated, can make a dose from a film to a silicon substrate uniform for each time. The method includes preparing a vacuum chamber having a film containing an impurity formed on an inner wall thereof such that, when the film is attacked by ions in plasma, the amount of an impurity to be doped into the surface of a sample by sputtering is not changed even though the plasma containing the impurity ions is repeatedly generated in the vacuum chamber; placing the sample on the sample electrode; and irradiating the plasma containing the impurity ions so as to implant the impurity ions into the sample, and doping the impurity into the sample by sputtering from the film containing the impurity fixed to the inner wall of the vacuum chamber.

19 Claims, 16 Drawing Sheets

U.S. PATENT DOCUMENTS

| | | | |
|---|---|---|---|
| 5,607,509 | A | 3/1997 | Schumacher et al. |
| 5,789,292 | A | 8/1998 | Yamazaki et al. |
| 5,851,906 | A | 12/1998 | Mizuno et al. |
| 5,962,858 | A | 10/1999 | Gwinn |
| 6,165,876 | A | 12/2000 | Yamazaki et al. |
| 6,403,410 | B1 | 6/2002 | Ohira et al. |
| 6,435,196 | B1 | 8/2002 | Satoh et al. |
| 2001/0037939 | A1 | 11/2001 | Nakaoka et al. |
| 2004/0045507 | A1 | 3/2004 | Okumura et al. |
| 2004/0251424 | A1 | 12/2004 | Murata et al. |
| 2005/0016838 | A1 | 1/2005 | Murata et al. |
| 2005/0051272 | A1 | 3/2005 | Collins et al. |
| 2005/0170669 | A1 | 8/2005 | Okumura et al. |
| 2005/0269520 | A1 | 12/2005 | Horsky et al. |
| 2005/0287776 | A1 | 12/2005 | Sasaki et al. |
| 2006/0019039 | A1 | 1/2006 | Hanawa et al. |
| 2006/0183350 | A1 | 8/2006 | Kudo et al. |
| 2006/0264051 | A1 | 11/2006 | Thibaut |
| 2007/0023700 | A1 | 2/2007 | Koezuka et al. |
| 2007/0026649 | A1 | 2/2007 | Okumura et al. |
| 2007/0037367 | A1 | 2/2007 | Okumura et al. |
| 2007/0048453 | A1 | 3/2007 | Qin et al. |

FOREIGN PATENT DOCUMENTS

| | | |
|---|---|---|
| JP | 8-293279 A | 11/1996 |
| JP | 9-115852 A | 5/1997 |
| JP | 11-87261 A | 3/1999 |
| JP | 11-154482 A | 6/1999 |
| JP | 11-329266 | 11/1999 |
| JP | 3340318 | 8/2002 |
| JP | 2004-47695 A | 2/2004 |
| JP | 2004-179592 A | 6/2004 |
| JP | 2005-109453 | 4/2005 |
| WO | WO 2004/109785 | 12/2004 |
| WO | WO2005/020306 | 3/2005 |

OTHER PUBLICATIONS

Cheung, N.W., "Plasma Immersion Ion Implantation for ULSI Processing", Nuclear Instruments and Methods in Physics Research: Beam Interactions with Materials and Atoms, vol. B55, No. 1/4, Apr. 1991.

Mizuno et al., "New Methods for Ultra Shallow Boron Doping by Using Plasma—Plasma-Less and Sputtering", International Conferences on Solid State Devices and Materials, Aug. 1995, pp. 1041-1042.

Greiner et al., "RF Sputtering Technique", IBM Technical Disclosure Bulletin, vol. 17, No. 7, pp. 2172-2173.

Bunshah, "Deposition Technologies for Films and Coatings", Chapter 5, pp. 170-237, Noyes Publishing, 1982.

Guarnieri, C.R. et al., "RF Ion Source", IBM Technical Disclosure Bulletin, Apr. 1982, pp. 5833-5835.

Sasaki et al. "$B_2H_6$ Plasma Doping with in-situ He Pre-amorphization", Symposium on VLSI Tech. p. 180-181, 2004.

Mizuno et al. "Plasma Doping into the Side-Wall of Sub-0.5μm Width Trench", Extended Abstracts of the 19th Conference on Solid State Devices and Materials, 1987, p. 319-322, Tokyo.

Mizuno et al. "Plasma doping for silicon", Surface and Coatings Technology, 1996, p. 51-55, vol. 85.

Mizuno et al. "Plasma Doping of Boron for Fabricating the Surface channel Sub-quarter micron PMOSFET", Symposium on VLSI. Technology Digest of Technical Papers. 1996, p. 66-67.

International Technology Roadmap for Semiconductors 2001 Edition. 2001. p. 223-225.

Cheung, Nathan W., "Plasma immersion ion implantation for ULSI processing", Nuclear Methods and Methods in Physics Research, 1991, pp. 811-820, B55, Elsevier Science Publishers B.V.

Yamashita, F., et al., "Direct Joule Heating of Nd-Fe-B Based Melt-Spun Powder and Zinc Binder", 1999, IEEE.

Chu, P.K., et al., "Part one of two, Plasma Doping: Progress and potential", Solid State Technology, Sep. 1999, pp. 55-60, www.solid-state.com.

Chu, P.K., et al., "Part two of two, Plasma Doping: Progress and potential", Solid State Technology, Oct. 1999, pp. 77-82, www.solid-state.com.

Hori, A., et al., "CMOS Device Technology toward 50 nm Region—Performance and Drain Architecture—", IEDM, 1999, pp. 641-644, IEEE.

Kwok, Dixon T.K., et al., "Energy distribution and depth profile in $BF_3$ plasma doping", Surface and Coatings Technology, 2001, pp. 146-150, vol. 136, Elsevier Science B.V.

Yamashita, F., et al., "Nd-Fe-B Thin Arc-shaped Bonded Magnets for Small DC Motors Prepared by Powder Compacting Press with Ion-implanted Punches", J. Mgn. Soc. Japan, 2001, pp. 683-686, vol. 25, No. 4-2.

Yamashita, F., et al., "Preparation of a Solid Rotor Composed of a Highly Dense Ring-Shaped RE Bonded Magnet and an Iron-Dust Core", Trans. Magn. Soc. Japan., 2002, pp. 111-114, vol. 2, No. 3.

Mizuni, B., "Ultra Shallow Junction for sub-50NM CMOS—The role of Plasma Doping-", UJTLab, pp. 10-13, Ultimate Junction Technologies Inc.

Sasaki, Y., et al., "$B_2H_6$ Plasma Doping with In-situ He Pre-amorphization", Symposium on VLSI Technology Digest of Technical Papers, 2004, pp. 180-181, IEEE.

Sasaki, Y., et al., "Plasma Doped Shallow Junction Formation", Matsushita Technical Journal, Dec. 2004, pp. 404-409, vol. 50 No. 6.

Tsutsui, K., et al., "Doping Effects from Neutral $B_2H_6$ Gas Phase on Plasma Pretreated Si Substrates as a Possible Process in Plasma Doping", The Japan Society of Applied Physics, 2005, pp. 3903-0907, vol. 44 No. 6A.

Mizuno, B., et al., "De-Excitation Pathways of highly-Excited Self-Trapped Exciton and Electron Plus Self-Trapped Hole", Journal of the Physical Society of Japan, Jun. 1983, pp. 1901-1903, vol. 52 No. 6.

Mizuno, B., "Excitation-Induced Atomic Motion of Self-Trapped Excitons in RbCl: Reorientation and Defect Formation", Journal of the Physical Society of Japan, Sep. 1986, pp. 3258-3271, vol. 55 No. 9.

Mizuno. B., et al., "Effect of Hydrogen on Oxygen Removal from Silicon-Overlayer on Insulator formed by $O^+$ Implantation", pp. 637-640, Semiconductor Research Center, Matsushita Electric Industrial Co., Ltd.

Fujita, T., et al., "Electron Paramagnetic Resonance Studies of Defects in Oxygen-implanted Silicon", Jaanese Journal of Applied Physics, Jul. 1987, pp. L1116-L1118, vol. 26 No. 7.

Mizuno, B., et al., "Effective removal of oxygen from Si layer on burned oxide by implantation of hydrogen", J. Appl. Phys., Sep. 1987, pp. 2566-2568, vol. 62 No. 6.

Mizuno, B., et al., "New doping method for subhalf micron trench sidewalls by using an electron cyclotron resonance plasma", Appl. Phys. Lett., Nov. 1988, pp. 2059-2061, vol. 53 No. 21, American Institute of Physics.

Shimizu, N., et al., "Reduction of Thickness Secondary Defects in MeV Ion Impalted Silicon by Intrinsic Gettering", Extended Abstracts of the 21st Conference on Solid State Devices and Materials, Tokyo, 1989, pp. 177-180.

Hori, A., et al., "A 0.05 μm-CMOS with Ultra Shallow Source/Drain Junctions Fabricated by 5KeV Ion Implantation and Rapid Thermal Annealling", 1994, pp. 485-488, IEDM.

Hori, A., et al., "Fabrication and Characteristics of Room Temeprature 0.05 μm-CMOS—Possibility and Design Concept of Sub-0.1 μm MOS Devices-", Technical Report of IEICE, 1995, pp. 41-46, The Institute of Electronics, Information and Communication Engineers.

Mizuno, B., et al. "Plasma doping for silicon", Surface and Coatings Technology, 1996, pp. 51-55, vol. 85, Elsevier Science S.A.

Mizuno, B., et al., "Plasma Doping of Boron for Fabricating the Surface Channel Sub-quarter micron PMOSFET", Symposium on VLSI Technology Digest of Technical Digest of Technical Papers, 1996, IEEE.

Takase, M., et al., "An evaluation method for a high concentration profile produced in very low energy doping processes", Nuclear Instruments and Methods in Physics Research, 1997, pp. 288-290, vol. 121, Elsevier Science B.V.

Takase, M., et al., "Suppressing Ion Implantation Induced Oxide Charging by Utilizing Physically Damaged Oxide Region", Jpn. J. Appl. Phys., Mar. 1997, pp. 1618-1621, vol. 36 Part 1, No. 3B.

Mizuno. B., et al., "Plasma Doping", pp. 165-170, Central Research Laboratory, Matsushita Electric Industrial Co., Ltd.

Kadokura, M., et al, "Analysis and Design Of At-Cut Quartz Resonators by three dimensional finite element method", EEP-vol. 19-1, Advances in Electronic Packaging, 1997, pp. 1101-1108, vol. 1, ASME 1997.

Mizuno. B., et al., "Plasma Doping and Plasma-Less Doping of Semiconductor", Mat. Res. Soc. Symp. Proc., 1997, pp. 345-950, vol. 438, Materials Research Society.

Takase, M., et al., "New Doping Technology-Plasma Doping—for Next Generation CMOS process with Ultra Shallow Junction—LSI Yield and surface contamination issues -", 1997, pabes B9-B12, IEEE.

Takase, M., et al., "Shallow Source/Drain Extensions for pMOSFETs with High Activation and Low Process Damage Fabricated by Plasma Doping", IEDM, 1997, pp. 475-478, IEEE.

Jin, C.G., "Hard X-ray Photoelectron spectroscopy (HX-PES) study on chemical binding states of ultra shallow plasma-doped silicon layer for the application of advanced ULSI devices", 2006, pp. 116-119, IEEE.

Mizuno, B., et al., "Plasma Doping and Subsequent Rapid Thermal Processing for Ultra Shallow Junction Formation", 13th IEEE International Conference on Advanced Thermal Processing of Semiconductors—RTP, 2005, IEEE.

Mizuno, B., et al., "Plasma Doping", 2004, pp. 423-427, IEEE.

Sasaki, Y., et al., "Gas Phase Doping at Room Temperature", Extended Abstract of International Workshop on Junction Technology, 2002, pp. 39-40, Japan Society of Applied Physics.

Sasaki, Y., et al., "Helicon Wave Plasma Doping System", Extended Abstract of International Workshop on Junction Technology, 2002, pp. 37-38, Japan Society of Applied Physics.

Jin, C.G., et al., "Estimation of Ultra-Shallow Plasma Doping (PD) Layer's Optical Absorption Properties by Spectroscopic Ellipsometry (SE)", 2004, pp. 102-103, IEEE.

Shimizu, N., et al., "Secondary Defect Reduction by Multiple MeV Boron Ion Implantation", Extended Abstract of the 22nd (1990 International) Conference on solid State Devices and Materials, Sendai, 1990, pp. 449-452.

Sasaki, Y., et al., "New method of Plasma doping with In-situ Helium pre-amorphization", Nuclear Instruments and Methods in Physics Research B 237, 2005, pp. 41-45, Elsevier B.V.

Jin, C.G., "Ultra shallow p$^+$/n junction formation by plasma doping (PD) and long pulse all solid-state laser annealing (ASLA) with selective absorption modulation", Nuclear Instruments and Methods in Physics Research B 237, 2005, pp. 58-61, Elsevier B.V.

Mizuno, B., et al., "Plasma Doping and Plasma-Less Doping for SI: Application to the sub-quarter micron Surface Channel PMOSFET and Solid Plasma Source Application for Safety Operation", Semiconductor Research Center, Matsushita Electric Industrial Co., Ltd.

Liu, H., et al., "A New Plasma-Aided Solid-Source Implantation Method for Ultra-Shallow p+/n Junction Fabrication", Engineering Research Center for Plasma-Aided Manufacturing, University of Wisconsin-Madison.

Mizuno, B., "Plasma Doping Into the Side-Wall of a Sub-0.5 μm Width Trench", Extended Abstracts of the 19th Conference on Solid State Devices and Materials, Tokyo, 1987, pp. 319-322.

Mizuno, B., "Plasma Doping Technology", Applied Physics, 2001, pp. 1458-1462, vol. 70.

Takase, M., et al., "Shallow Source/Drain Extensions for pMOSFETs with High Activation and Low Process Damage Fabricated by Plasma Doping", Technical Report of IEICE, 1998, The Institute of Electronics, Information and Communication Engineers.

Mizuno, et al., "Ultralow Energy Doping Plasma Doping", Special Issue—Currently Developed Ion Engineering Technology-1.

Mizuno, B., et al., "Plasma Based Ion Implantation—Plasma Doping", High Temperature Science Journal, May 1996, pp. 114-120, vol. 3 No. 22.

Tatsumi, T., et al., "Multilevel Interconnection Technology using Fluorinated Amorphous Carbon films", 3p-ZX-3, Silicon Systems Research Laboratories, NEC Corporation.

Mizuno. B., et al., Plasma doping for fabricating ultra shallow junction, 3p-ZX-4, Matsushita Electric Industrial Co., Ltd.

Oda, H., et al., "Demand for Junction Technology in CMOS Transistors", 27a-ZL-1, 49th Applied Physics Lecture Series—Lecture Manuscripts, Comprehensive Lectures within the Area, 2002, Tokai University.

Mizuno, B., et al., "Junction Technologies: Status Quo and Perspectives", 27a-ZL-2, Comprehensive Lectures within the Area.

Hata, N., et al., "Characterization of Low-k Dielectrics by Z-ray Scattering- Anisotropy in Pore Diameter and its Suppression", 26p-M-19, 63rd Applied Physics Lecture Series—Lecture Manuscripts, 2002, Niigaka University.

Shimanuki, J., et al., "Behavior of pores in a thin low-k film during anneal—Ex-situ TEM observation method", 26p-M-20.

Sasaki, Y., et al., "In-situ Beam Current Monitor for Ion Implanter", 25a-G-1, pp. 768.

Higaki, R., et al., "Plasma Doping and Plasma Assisted Gas Doping", 25a-G-2, 63rd Applied Physics Lecture Series—Lecture Manuscripts, 2002, Niigaka University.

Kurosawa, J., et al., "Development of Ni-B-P-Pt type liquid metal ion source for formation of Ni-nano dopant array by single ion Implantation", 25a-G-3, 63rd Applied Physics Lecture Series—Lecture Manuscripts, 2002, Niigaka University.

Imamura, K., et al., "Development of key-techniques for co-doping of acceptor and donor by single ion Implantation", 25a-G-4, 63rd Applied Physics Lecture Series—Lecture Manuscripts, 2002, Niigaka University.

Yamashita, K., et al., "Development of Flash Lamp Annealer for 300mm Wafers", 29p-ZW-10, 50th Applied Physics Lecture Series—Lecture Manuscripts, 2003, Shinagawa University.

Kubo, Y., et al., "Development of advance single ion implantor", 29p-ZW-11, 50th Applied Physiscs Lecture Series—Lecture Manuscripts, 2003, Shinagawa University.

Higaki, R., et al., "Dose Control of gas Phase Doping at Room Temperature" 29p-ZW-12, 50th Applied Physiscs Lecture Series—Lecture Manuscripts, 2003, Shinagawa University.

Akama, S., et al., "The Surface Reaction mechanism of Gas Phase Doping at Room Temperature", 29p-ZW-13, 50th Applied Physiscs Lecture Series—Lecture Manuscripts, 2003, Shinagawa University.

Sasaki, Y., et al., "Behavior of H and contamination in the Plasma Doping (PD) process", 29p-ZW-14, 50th Applied Physiscs Lecture Series—Lecture Manuscripts, 2003, Shinagawa University.

Kurobe, K., et al., "Ultra-shallow n+/p Junction Formation by Heat-assisted Excimer Laser Annealing", 29p-ZW-15, 50th Applied Physiscs Lecture Series—Lecture Manuscripts, 2003, Shinagawa University.

Fujinami, M., et al., "Research in Pores and Oxygen Compound Deficits in Si Due to the Positron Annihilation Coincidence Doppler Broadening Method, Positron Annihilation Coincidence Doppler Broadening Methods for Vacancy-Oxygen Complexes in Si", 1a-A-8, 64th Applied Physics Lecture Series—Lecture Manuscripts, 2003, Fukuoka University.

Miyagoe, T., et al., "Behavior Research on Deficits in Noble Gas Ion Implanted Si Using a Positron Beam, Positron beam study of defects induced by noble gas implanted Si", 1a-A-9, 64th Applied Physics Lecture Series—Lecture Manuscripts, 2003, Fukuoka University.

Higaki, R., et al., "Effects on the Substrate Surface conditions with Gas Doping Having Used Plasma Preprocessing, Effects of substrate surface condition on gas-phase doping using plasma pretreatment", 1a-A-10, 64th Applied Physics Lecture Series—Lecture Manuscripts, 2003, Fukuoka University.

Itoh, H., et al., "Ultra-low energy Ion Implantation in Si II", 30p-ZQ-9, Preprints of the 67th Meeting of the Japan Society of Applied Phsyics, 2006, Ritsumelkan University.

Matsuda, T., et al., "Spike RTA Induced Changes in Chemical Bondings and Their Depth Profile of Plasma-doped Boron", 30p-

ZQ-10, Preprints of the 67th Meeting of the Japan Society of Applied Physics, 2006, Ritsumeikan University.

Tanaka, Y., et al., "8nm (5E18cm$^{-2}$) Ultra Shallow Junction Formation by Double-Pulsed Green Laser Annealing", 30p-ZQ-11, Preprints of the 67th Meeting of the Japan Society of Applied Physics, 2006, Ritsumeikan University.

Haya, A., et al., "Surface Modification of Plastic Substrate by Atomic Hydrogen Anneal and Effect of AHA to Film Deposition", 29p-SM-1, Preprints of the 54th Meeting of the Japan Society of Applied Physics and Related Societies, 2007, Aoyama Gakuin University.

Ohashi, Y., et al., "Effects of Hydrogenation on Chemical Activity of Defects in Polycrystalline Silicon Thin films", 29p-SM-2, Preprints of the 54th Meeting of the Japan Society of Applied Physics and Related Societies, 2007, Aoyama Gakuin University.

Watanabe, M., et al., "Study of Activated Boron Depth Profiles and Ultra-Shallow P+ Layers Formed by Plasma Doping Method", 29p-SM-3, Preprints of the 54th Meeting of the Japan Society of Applied Physics and Related Societies, 2007, Aoyama Gakuin University.

Ishiba, T., et al., "Lattice Strains in High Energy Ion Implated Silicon Subjected to Thermal Annealings", 27a-SN-13.

Shimizu, N., et al., "Secondary Defect Reduction of Multiple MeV Ion Implatation (II)", 27a-SN-14.

Nakata, J., "The Low-Temperature Crystallization and Amorphization Mechanism of Amorphous Si by High Energy Heavy-Ion Beam Irradiation", 27a-SN-15.

Matsumoto, M., "The Influence of Pre-oxidation Cleaning on Grotwh of Oxide Film (II)", 28a-D-1.

Uchida, H., et al., "Influence of Cleaning methods on Dielectric Breakdown in Thin $Sio_2$", 28a-D-2.

Takiyama, M., et al., "Electrical Characteristics of Al MOS Diode Contaminated with Cu-I", 28a-D-3.

Shimizu, N., et al., "Secondary Defect Reduction of Multiple MeV Ion Implantation (III)", 31a-X-5.

Kimoto, K., et al., "Rapid Thermal Annealing for High-energy Ion Implanted Si (V)" 31a-X-6.

Koyama, Y., et al., "Rapid Thermal Annealing for High-energy Ion Implanted Si (VI)" 31a-X-7.

Suzuki, H., et al., "Preamorphization by si Double Ion Implantation", 9p-C-12.

Takamatsu, H., et al., "Evaluation of Anneal Effect by Photoacoustic Displacement Measurement", 9p-C-13.

Shimizu, N., et al., "Effects of Junction Leakage Current Reduction of Additional High Energy Si Ion Implantation", 9p-C-14.

Katsumoto, M., et al., "The Effect of NH40H/H202 Cleaning on C-V Characteristics of MOS Capacitor", 11p-B-12.

Shinno, H., "Ellipsometric Measurements of Silicon Surfaces During Oxidation in R.F. Plasma", 11p-B-13.

Maekawa, M., et al., "Effect of H2SO4 Boiling on Silicon Surface", 11p-B-14.

Mizuno, B., et al., "Plasma-assisted Impurity Doping for ULSIs", 28p-ZP-10.

Itatani, R., "Introductory Talk, Matrial Processing Induced by Electron Beam", 28p-ZQ-1.

Tanimura, S., et al., D-255 Total Management System for VLSI Manufacturing, 1994 Spring Conference of the Institute of Electronics, Information and Communications Engineers, Matsushita Electric Industrial Co., Ltd.

Maekawa, T., et al., "Annealing of Ar$^+$ Implanted Damage", 30p-ZK-2.

Okahisa, M., et al., "Electrical Properties of High Energy Boron-Implanted Layers in Si", 30p-ZK-3.

Shimizu, N., et al., "Effects of n+ Layer Formation on Junction Leakage Current Using High Energy Ion Implantation", 30p-ZK-4.

Kinoshita, K., et al., "Optical Property Change of Silicon in Low Energy Ion Implantation (II)", 28a-ZW-8.

Mizuno, B., et al., "A Sputtering Effect During the Ion Implantation with Low Energy", 28a-ZW-9.

Kagawa, K., et al., "Effect of Charging During Ion Implantation on Devices", 28a-ZW-10.

Murakoshi, A., et al., "Formation of Ultra Shallow Diffusion Layer by Ultra Low Energy Ion Implantation", 26p-ZN-10.

Mizuno, B., et al., "Plasma Doping Method", 26p-ZN-11.

Fukuda, K., et al., "Fabrication of Ultra Shallow Junction by Spin-on Glass $SiO_2$ Film" 26p-ZN-12.

Ishii, M., "Quantitative Analysis of rare-Gas Ion Bombardment Damage of Si Surface using XPS", 26p-ZP-6.

Takase, M., et al., "Evaluation Method of Hifh concentration Profile for Low Energy Ion Implantation", 26p-ZP-7.

Nakamura, T., et al., "Influence of simultaneously Implanted As+ Ions on diffusivity and activation efficency of B atoms implanted into silicon", 26p-ZP-8.

Akiyama, H., et al., "The life-time control technique for power devices using high-energy heavy Ion radiation", 28a-P-6.

Takase, M., et al., "The Indentification of the Region of Ion Implantation Induced Physical Damaged Layer", 28a-P-7.

Tamura, F., et al., "Measurement of the minority carrier lifetime for the SI epitaxial layer", 28a-P-8.

Mizuno, B., et al., "Room Temperature Vapor Phase Doping (RTVD)", 28p-P-4.

Mizuno, B., et al., "Plasma Doping Applicable to sub-1/4 micron PMOS", 28p-P-5.

Kujirai, H., et al., "Ultra-shallow, low resistance junction formation by solid-phase diffusion of boron from BSG", 28p-P-6.

Takase, M., et al., "Dosage Control by Plasma Emission in Plasma Doping Process", 7a-P-2.

Murakami, E., et al., "Formation of Ultrashallow Junctions by Sb Selective δDoping Technique", 7a-P-3.

Kiyota, Y., et al., the Role of Hydrogen during Rapid Vapor-phase Doping Analyzed by FTIR-ATR, 7a-P-4.

Takase, M., et al., "Fabrication of Low Sheet Resistance and Shallow Source/Drain Junction with Plasma Doping Process", 29a-G-2.

Shimada, N., et al., "Shallow Junction, Formation by Polyatomic Cluster Ion Implantation", 29a-G-3.

Ishikawa, T., et al., "Formation of shallow junctions by low-energy implantation", 29a-G-4.

Shimada, N., et al., "Shallow Junction Formation by Decaborane Ion Impantation (IV)", 3a-PC-13.

Mineji, A., et al., "Shallow Junction Formation by 0.2 keV-single B Ion Implantation", 3a-PC-14.

Takase, M., et al., "High Activation ultra Shallow Source/Drain Junction Fabricated by Plasma Doping", 3a-PC-15.

Nishida, S., et al., "the Herzog correction revisited", 7a-YP-8.

Ono, S., et al., "Design of a cryogenic current measuring device using a SQUID for low-intensity beams", 7a-YP-9.

Haruyama, Y., et al., "High resolution measurement of HeH$^+$ dissociative recombination with superconductor electron cooler", 7a-YP-10.

Tsurubuchi, S., et al., "Excitation cross sections for the resonance states of the Ne by electron impact", 7a-YP-11.

Wakabayashi, et al., "IEDM Focusing on high speed and low electric power techniques , Finally the Cu damascene technique for practical applications has arrived", IEDM Conference, 1997, IEEE.

Nakata, K., et al., "Fail Bit map Correlation Analysis System", The Institute of Electronics, Information and Communication Engineers (IEICE) Electronics Society Annual Meeting, 1995.

Tsubo, Y., et al., "Diffusion of Phosphorus from P-doped Polysilicon through Ultrathin siO2 into Si Substrate", 30p-ZP-11.

Aoyama, T., et al., "Boron Diffusion in Silicon Dioxide in the Presence of Hydrogen and Fluorine", 30p-ZP-12.

Takase, M., et al., "Effect of oxide thickness on boron profile in the plasma doping process", 30p-ZP-13.

Mizuno, B., et al., "Plasma Doping", Invitational Lecture.

Takase, M., et al., "Plasma doping Technology for the MOS transistor with a channel length below 0.15 μm", Applied Physics, 1999, vol. 68 No. 5.

Sasaki, Y., et al., "Nondestructive Beam Current Monitor Using DC SQUID", pp. 68-76.

Kobayashi, K., et al., "Three-Dimensional Plasma Doping for Beam-Channel Transistor", 29p-ZG-13, Preprints of the 51st Spring meeting of the Japan Society of Applied Physics and Related Societies, Mar. 2004, Tokyo University of Technology.

Sato, T., et al., "Effect of wet cleaning treatment on dose of impurity after plasma doping", 29p-ZG-14, Preprints of the 51st Spring meeting of the Japan Society of Applied Physics and Related Societies, Mar. 2004, Tokyo University of Technology.

Takagi, K., et al., "Profile control by Helium plasma treatment In plasma doping method", 29p-ZG-15, Preprints of the 51st Spring meeting of the Japan Society of Applied Physics and Related Societies, Mar. 2004, Tokyo University of Technology.

Okashita, K., et al., "In-situ Plasma Pre-amorphization for Shallow Junction Formation", 3p-P10-14, Preprints of the 65th Meeting of the Japan Society of Applied Physics and Related Societies, Sep. 2004, Tohoku Gakuin University.

Nakazawa, H., et al., "Characterization of Boron/Phosphorus Layer by Cold/Heat Ion Implantation", 3p-P10-15, Preprints of the 65th Meeting of the Japan Society of Applied Physics and Related Societies, Sep. 2004, Tohoku Gakuin University.

Kobayashi, K., et al., "Doping Profile Evaluation for Three-Dimensional Transistor", 3p-P10-16, Preprints of the 65th Meeting of the Japan Society of Applied Physics and Related Societies, Sep. 2004, Tohoku Gakuin University.

Otakagi, K., et al., "Effect on Impurity profile of Helium Plasma Treatment on a Plasma Doping Method", 65th Japan Society of Applied Physics Symposium Collection of Lectures, Sep. 2004, Tohoku Graduate Department.

Sauddin, H., et al., "Leakage Current in Mesa-type p+/n, Junctions Formed by Plasma Doping", 10a-A-10, PerPreprints of the 66th Meeting of the Japan Society of Applied Physics, 2005, Tokushima University.

Fukagawa, Y., et al., "Electrical Properties of ultra-Shallow p+ Layers Formed by Plasma Doping", 10a-A-11, PerPreprints of the 66th Meeting of the Japan Society of Applied Physics, 2005, Tokushima University.

Matsuda, T., et al., "Chemical Bonds of Boron Atoms Implanted In A Silicon Surface by Plasma Doping", 10a-A-12, PerPreprints of the 66th Meeting of the Japan Society of Applied Physics, 2005, Tokushima University.

Mizuno, B., et al., "Reduction of lattice defect in Si layer on buried oxide by implantation of hydrogen,", SDM 87-169, Basic Research Lab., Semiconductor Research Center, Matsushita Electric Industrial Co., Ltd.

Mizuno, B., et al., "ECR Plasma Doping", SDM 88-95, Semiconductor Research Center, Semiconductor Basic Research Lab., Matsushita Electric Industrial Co., Ltd.

Mizuno, B., et al., "ECR Plasma Doping", Electronic Material, Dec. 1987.

Mizuno, B., "Plasma Doping Technology", Semiconductor Research Center, Matsushita Electric Industrial Co., Ltd.

Nakada, K., et al., "D-258 Development of Cleanroom Auto Control System", 1994 Spring Conference of the Society of Electronic Information and Communications.

Mizuno, B., et al., "Behavior of Implanted Ions Near the Surface—Outer Diffusion and Self-sputtering", 28p-ZL1.

Yamanishi, Y., et al., "Behavior during Oxidation of Nitrogen Introduced by Ion Implantation", 28p-ZL2.

Zaizu, Y., et al., "Effects of Silicon Nitride Films on Boron Enhanced Diffusion and Crystalline Defects due to Boron Implantation", 28p-ZL3.

Mizuno, B., et al., "Behavior near Surface of Implanted Ions (cont'd) Self-sputtering and Back-scattering", 20p-ZE-11.

Kinoshita K., et al., "Optical Changes in Association with Crystalline Damage due to Low Energy Ion Implantation (IV)", 20p-ZE-12.

Hasegawa, K., et al., "Dual Species (B, As) Implantation in Silicon", 28p-ZE-13.

Sato, T., et al., "Dose Volume changes and HF Cleansing Before and After Plasma Doping Change dose caused by HF treatment before and after plasma doping", 1a-A-11, 64th Applied Physics Lecture Series- Lecture Manuscripts, 2003, Fukuoka University.

Susuki, K., "High Tilt Angle Ion Implantation in Polycrystalline Si, High tilt angle ion implantation into Polycrystalline silicon", 1p-A-1, 64th Applied Physics Lecture Series- Lecture Manuscripts, 2003, Fukuoka University.

Yamada, M., et al., "Evaluation of Junction Leak Current Caused by Element Isolation Stress, Study of junction leakage currents induced by the stress of shallow trench isolation", 1p-A-2, 64th Applied Physics Lecture Series- Lecture Manuscripts, 2003, Fukuoka University.

Aiba, I., et al., "Dose Variation by Chemical Cleaning Process after Plasma Doping", 3p-P10-18, 65th Japan Society of Applied Physics Symposium Collection of Lectures, Sep. 2004, Tohoku Graduate Department.

Majima, M., et al., "Hall Effect Measurement of ultra Shallow $p^+n$ Junctions formed by Plasma Doping", 3p-P10-19, 65th Japan Society of Applied Physics Symposium Collection of Lectures, Sep. 2004, Tohoku Graduate Department.

Masuda, T., et al., "Amorphization of Large-scale Silicon Substrate by using hybrid Quantum Chemical Molecular Dynamics Method", 1a-YE-7, 52nd Japan Society of Applied Physics Symposium Collection of Lectures, 2005, Saitama University.

Fukugawa, Y., et al., "Examination of pre-amorphous layer formation process by He plasma irradiation", 1a-YE-8, 52nd Japan Society of Applied Physics Symposium Collection of Lectures, 2005, Saitama University.

Aiba, I., et al., "Plasma Doping on Si substrates with Resist Patterns", 1a-YE-9, 52nd Japan Society of Applied Physics Symposium Collection of Lectures, 2005, Saitama University.

Okashite, K., et al., "Ultra Shallow Junction Formation with Plasma Doping and Spike RTA", 1a-YE-10, 52nd Japan Society of Applied Physics Symposium Collection of Lectures, 2005, Saitama University.

Sauddin, H., "Leakage Current Characteristics of Ultra-shallow p+/n Junctions Formed by Plasma Doping", 1a-YE-11, 52nd Japan Society of Applied Physics Symposium Collection of Lectures, 2005, Saitama University.

Matsuno, A., et al., "One Dimensional Thermal Diffusion Simulation for the USJ formation by green laser anneal with absorption layer", 16-YE-1, 52nd Japan Society of Applied Physics Symposium Collection of Lectures, 2005, Saitama University.

Mizuno, B., et al., "ECR Plasma Doping", Matsushita Electric Industrial Co., Ltd.

Higaki, R., et al., "Effects of gas phase absorption into SI substrates on plasma doping process".

Lenoble, D., et al., "Fabrication of 60-nm plasma doped CMOS transistors", 2002, IEEE.

Ito, T., et al., "Improvement of Threshold Voltage Roll-off by Ultra-shallow Junction Formed by Flash Lamp Annealing", 2003, Symposium on VLSI Technology Digest of Technical Papers.

Severi, S., et al., "Diffusion-less junctions and super halo profiles for PMOS transistors formed by SPER and FUSI gate in 45nm physical gate length devices", 2004, IEEE.

(a) IN-PLANE UNIFORMITY 1 OF COMPARATIVE EXAMPLE OF FIG. 8 (6.54%, FIRST SHEET, SEE FIG. 8)
(b) IN-PLANE UNIFORMITY 2 OF EXAMPLE OF FIG. 8 (1.59%, 1375-TH SHEET, SEE FIG. 8)
(c) IN-PLANE UNIFORMITY 1 OF EXAMPLE OF FIG. 8 (1.81%, 1000-TH SHEET, SEE FIG. 8)

(a) IN-PLANE UNIFORMITY 1 OF COMPARATIVE EXAMPLE OF FIG. 4 (1.54%, FIRST SHEET, SEE FIG. 4)
(b) IN-PLANE UNIFORMITY 2 OF COMPARATIVE EXAMPLE OF FIG. 4 (6.00%, 125-TH SHEET, SEE FIG. 4)

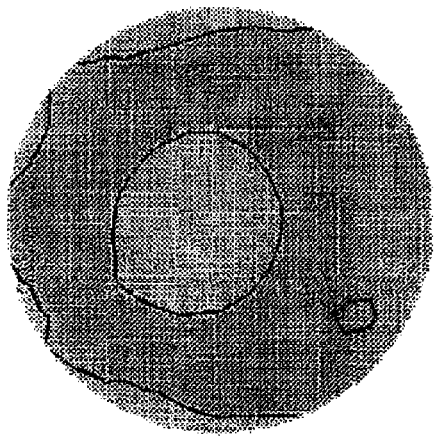
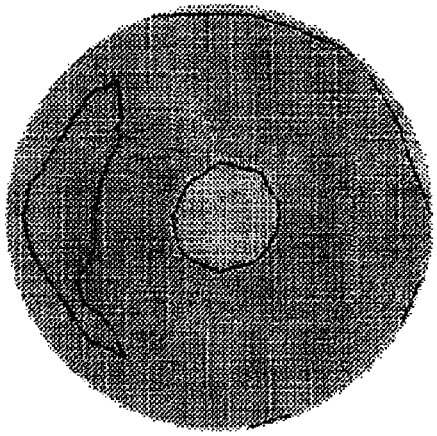
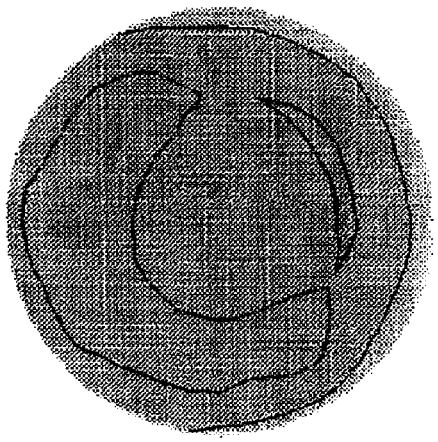
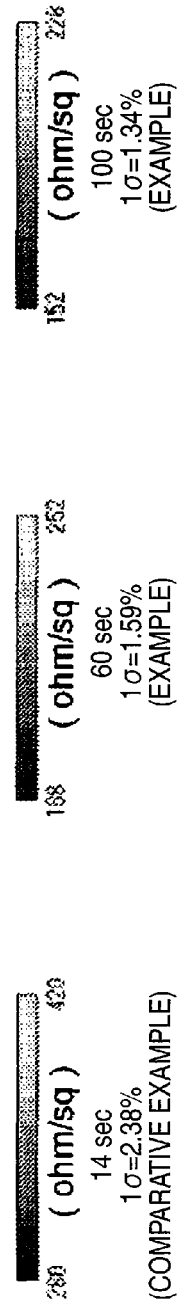
FIG. 13 (a)
14 sec
1σ=2.38%
(COMPARATIVE EXAMPLE)
FIG. 13 (b)
60 sec
1σ=1.59%
(EXAMPLE)
FIG. 13 (c)
100 sec
1σ=1.34%
(EXAMPLE)
(a) IN-PLANE UNIFORMITY 1 OF COMPARATIVE EXAMPLE OF FIG. 9 (2.38%, 14 sec, SEE FIG. 9)
(b) IN-PLANE UNIFORMITY 2 OF EXAMPLE OF FIG. 9 (1.59%, 60 sec, SEE FIG. 9)
(c) IN-PLANE UNIFORMITY 1 OF EXAMPLE OF FIG. 9 (1.34%, 100 sec, SEE FIG. 9)

STATE UPON TRANSFER OF SEMICONDUCTOR SUBSTRATE

STATE UPON PLASMA DOPING

PLASMA DOPING METHOD AND PLASMA DOPING APPARATUS

RELATED APPLICATIONS

This application is a continuation of U.S. patent application Ser. No. 11/647,235, filed on Dec. 29, 2006, which is a continuation of International Application No. PCT/JP2006/309509, filed on May 11, 2006, which in turn claims the benefit of Japanese Application No. 2005-140405, filed on May 12, 2005, the disclosures of which Applications are incorporated by reference herein.

BACKGROUND OF THE INVENTION

1. Field of the Invention

The present invention relates to a plasma doping method, a plasma doping apparatus used therefor, and a silicon substrate formed using the same. In particular, the invention relates to a method of performing plasma doping that dopes an impurity into a surface of a solid sample, such as a semiconductor substrate or the like.

2. Description of the Related Art

As a technology for doping an impurity into a surface of a solid sample, there is known a plasma doping (PD) method that ionizes the impurity and dopes the ionized impurity into a solid at low energy (for example, see Patent Document 1).

Meanwhile, among methods of doping an impurity, an ion implantation method is most widely used at present. As will be apparent from Non-Patent Document 1, the plasma doping method is also described in ITRS2003 as a next-generation technology of ion implantation. The plasma doping method is different from the ion implantation method.

A technical difference between ion implantation and plasma doping will now be described in detail.

In the ion implantation method, an apparatus having the following configuration is used. The apparatus includes an ion source that generates plasma from gas, an analysis magnet that performs mass separation in order to select desired ions among ions extracted from the ion source, an electrode that accelerates the desired ions, and a process chamber that implants the accelerated desired ions into a silicon substrate. In the ion implantation, in order to implant the impurity shallow, it is preferable to set energy extracting ions from the ion source and acceleration energy small.

However, when the extraction energy is set small, the number of ions to be extracted is decreased. In addition, when the acceleration energy is set small, while an ion beam is transported from the ion source to a wafer, a beam diameter is widened due to a repulsive force by charges between the ions. Accordingly, the ion beam may collide against the inner wall of a beam line, and thus a large number of ions may be lost. For this reason, throughput of an implantation processing may be lowered. For example, when B+ ions are implanted, if the acceleration energy becomes 2 keV or less, the throughput starts to be lowered. Then, if the acceleration energy becomes 0.5 keV or less, the beam transportation itself may be difficult. Further, even though the acceleration energy is lowered to 0.5 keV, the B ions may be implanted at a depth of approximately 20 nm. That is, in case of forming an extension electrode having a thinner thickness, productivity may be lowered drastically.

In contrast, in the plasma doping method, an apparatus having the following configuration is used. The apparatus includes a plasma generation source that induces plasma into a cylindrical vacuum chamber, in which a silicon substrate can be disposed, a bias electrode, on which the silicon substrate is disposed, and a bias power supply that adjusts a potential of the bias electrode. That is, the apparatus has the configuration, in which the analysis magnet and the acceleration electrode are not provided, different from the apparatus used in the ion implantation. The bias electrode that serves as a plasma source and a wafer holder is provided in the vacuum chamber. Then, the ions are accelerated and introduced by a potential to be generated between the plasma and the wafer. With this configuration, since low-energy plasma can be directly used, a large amount of low-energy ions can be irradiated onto the wafer, compared with the ion implantation. That is, a dose rate is considerably high. For this reason, in the low-energy B-ion implantation, high throughput can be kept.

With the application of the plasma doping method, the inventors have developed a process technology that forms a source-to-drain extension electrode having a very small thickness and low resistance. This new process technology is known as a process technology that has particular effects (Non-Patent Document 2).

In this method, doping material gas, such as $B_2H_6$, that is introduced from a gas introduction port is plasmized by a plasma generation unit having a microwave waveguide and an electric magnet. Then, boron ions in plasma are supplied to a surface of a sample by a high-frequency power supply.

With the reduction in size and high integration of a semiconductor device, characteristics in an impurity doped region are very important. Among these, a dose (impurity doping amount) determines low resistance that is one of important elements in determining element characteristics. Accordingly, the control of the dose is very important.

If the plasma doping method is used, it can be seen that the source-to-drain extension electrode having a very small thickness and low resistance can be formed. However, a control method of the dose for controlling the element characteristics has not been developed yet. Up to now, a method that changes the dose by changing a plasma doping time has been tested, but this method does not obtain sufficient control precision and thus is unpractical.

In this situation, as a method that can increase safety by diluting toxic $B_2H_6$ having a serious risk to the human body as large as possible, can stably generate and keep plasma without degrading doping efficiency, and can easily perform the control of the dopant dose, the inventors has suggested the following method. In this method, $B_2H_6$ gas as a material containing an impurity to be doped is diluted with He gas having small ionization energy, then He plasma is generated earlier, and subsequently $B_2H_6$ is discharged (Patent Document 2). In this method, there has been suggested that the concentration of $B_2H_6$ gas is preferably less than 0.05%.

When the concentration is low, for example, approximately 0.05%, although it is not reported that the dose is easily controlled, the dose is changed by changing the time while the gas concentration is kept constant. That is, when the $B_2H_6$ gas concentration is low, the change in the dose is small with respect to the change in time, and thus the dose is easily controlled. Here, there is a progress in that the control precision of the dose is increased. However, in a plasma doping method that forms an impurity doped layer in the surface of the sample by generating plasma in the vacuum chamber and causing impurity ions in plasma to collide against the surface of the sample, the dose may be changed each time plasma is irradiated onto the silicon substrate, regardless of the same plasma condition, and reproducibility may be degraded. This is because, even though plasma is generated in the vacuum chamber in order to implant ions into the silicon substrate, the state in the vacuum chamber is changed for each time accordingly. Accordingly, it is difficult to adjust the dose with good reproducibility. In addition, since the state in the vacuum chamber is changed for each time, it is difficult to keep an in-plane dose of the silicon substrate uniformly. The dose can be made uniform by adjusting possible parameters or the shape of the apparatus, but the uniform dose cannot be repeatedly reproduced.

Patent Document 1: U.S. Pat. No. 4,912,065 (Specification)

Patent Document 2: JP-A-2004-179592

Patent Document 3: Japanese Patent No. 3340318

Non-Patent Document 1: Column of Shallow Junction Ion Doping of FIG. 30 of Front End Process in International Technology Roadmap for Semiconductors 2001 Edition (ITRS2001)

Non-Patent Document 2: Y. Sasaki, et al., Symp. on VLSI Tech. p 180 (2004)

Non-Patent Document 3: B. Mizuno et al., Plasma Doping into the side-wall of a sub-0.5 μm width Trench, Ext. Abs. of International Conference on SSDM, p. 317 (1987)

Non-Patent Document 4: B. Mizuno, et al., Plasma Doping for silicon, Surface Coating tech., 85, 51 (1996)

Non-Patent Document 5: B. Mizuno, et al., Plasma Doping of Boron for Fabricating the Surface Channel Sub-quarter micron PMOSFET, symp. VLSI Tech, p. 66 (1996)

As described above, it is known that the state in the vacuum chamber is changed for each time, but why the change occurs is not clear. As the result of various studies, the inventors have focused that a film is formed on an inner wall of a vacuum chamber as a plasma chamber and the state of the film is changed. Specifically, if a plasma doping treatment is repeated using mixture gas plasma of $B_2H_6$ gas and helium gas, the color concentration of the film and the formation area of the film are changed. That is, the inventors have focused that the thickness of the film becomes larger and the formation area of the film is increased. The invention has been finalized from this viewpoint. The inventors have supposed that the plasma concentration of the surface of the sample is changed when the film containing the impurity fixed to the inner wall of the vacuum chamber is attacked (sputtered) by ions in plasma or the variation is changed by the thickness of the film and the formation area of the film. In addition, the inventors have supposed that the change depends on the density of the impurity contained in a unit volume of the film.

According to the experiment result of the inventors, the dose of the impurity that is doped into the surface of the silicon substrate from a film containing the impurity fixed to the inner wall of the vacuum chamber is changed for each time.

The invention has been finalized in consideration of the above problems, and it is an object of the invention to provide a plasma doping method that can make a dose from a film to a silicon substrate for each time uniform even though a plasma processing is repeated.

The invention performs dose control and in-plane uniformity on the basis of a technical spirit that reverse the common knowledge of plasma doping up to now. According to the common knowledge of known plasma doping, the impurity is doped from ions, gas, radicals in plasma, and the material is supplied from a gas pipe connected to the vacuum chamber as gas. That is, the amount of the impurity contained in gas, the gas concentration or pressure, a mixture ratio of gas, and the like, determines the amount of the impurity doped into the surface of the semiconductor substrate. Accordingly, it is designed such that a plasma density or gas flow and a pressure distribution are made uniform on the surface of the semiconductor substrate. In addition, the adjustment of the dose is performed by adjusting the concentration of the impurity contained in gas to be supplied so as to adjust the concentration of the impurity contained in plasma or by adjusting an irradiation time of plasma.

In contrast, as the premise of the invention, it has been focused that a ratio of an impurity that is supplied from the gas pipe as gas, then plasmized, and subsequently doped into the surface of the semiconductor substrate is merely 15% to 30% of the total amount of the impurity to be doped by plasma doping. This is a numeric value that reverses the known common knowledge. In the related art, design of a process and the entire apparatus is performed on the basis of the spirit that the dose from gas plasma is a principal factor. In addition, in the invention, as the principal factor corresponding to remaining 85% to 70%, there is apparently the following phenomenon. That is, the film containing the impurity formed to be fixed to the inner wall of the vacuum chamber is exposed to plasma and sputtered while plasma doping is repeatedly performed. Then, the impurity doped into the film once is discharged in plasma again, and the discharged impurity is doped into the surface of the semiconductor substrate. The inventors have thought that a more accurate determination of the ratio of the factors relative to the dose requires future studies, and depends on the condition of plasma doping, but it is important to reduce the ratio of the dose from plasma that is considered as the principal factor in the related art. As considered in the related art, even though the parameters of plasma are adjusted, it can be seen that it is impossible to control the dose, stably keep repetitive uniformity, and perform a process with good reproducibility. That is, in order to control the dose, stably keep repetitive uniformity, and perform a process with good reproducibility, it is necessary to control a dose from the film containing the impurity as the principal factor and to secure stability. That is, it is necessary to adjust the film containing the impurity fixed to the inner wall of the vacuum chamber.

According to an aspect of the invention, there is provided a plasma doping method that places a sample on a sample electrode in a vacuum chamber, generates plasma in the vacuum chamber, and causes impurity ions in the plasma to collide against a surface of the sample so as to form an impurity doped layer in the surface of the sample. The plasma doping method includes a maintenance step of preparing the vacuum chamber having a film containing an impurity formed on an inner wall thereof such that, when the film containing the impurity fixed to the inner wall of the vacuum chamber is attacked by ions in the plasma, the amount of an impurity to be doped into the surface of the sample by sputtering is not changed even though the plasma containing the impurity ions is repeatedly generated in the vacuum chamber, a step of placing the sample on the sample electrode, and a step of irradiating the plasma containing the impurity ions so as to implant the impurity ions into the sample, and doping the impurity into the sample by sputtering from the film containing the impurity fixed to the inner wall of the vacuum chamber.

According to this configuration, the film is formed on the inner wall of the vacuum chamber such that the amount of the impurity to be doped into the sample by sputtering from the film containing the impurity of the inner wall of the vacuum chamber is not changed and then plasma doping is performed. Therefore, impurity doping can be stably performed with good reproducibility.

In the plasma doping method according to the aspect of the invention, the maintenance step may include, before forming the film containing the impurity, a substep of removing the film containing the impurity fixed to the inner wall of the vacuum chamber.

With this configuration, after the impurity stuck to the inner wall of the vacuum chamber is removed once, the film containing the impurity is formed again according to the conditions. Therefore, reliability can be improved.

In the plasma doping method according to the aspect of the invention, the sample may be a silicon substrate, and the film containing the impurity fixed to the inner wall of the vacuum chamber may be formed such that, when a dose of the impurity is the same level with a tolerance of ±10% even though the plasma containing the impurity ions is repeatedly generated in the vacuum chamber, the dose is made uniform in a surface of the silicon substrate.

With this configuration, the control can be performed with high accuracy.

The plasma doping method according to the aspect of the invention may further include a step of adjusting the shape of the inner wall of the vacuum chamber such that the amount of an impurity to be stuck to the inner wall of the vacuum chamber has a desired value.

For example, the shape of the inner wall of the vacuum chamber is adjusted such that, when the formation of the film is completed, the total distribution of the distribution of the impurity to be doped from the plasma containing the impurity ions and the distribution of the impurity to be doped by sputtering from the film containing the impurity fixed to the inner wall of the vacuum chamber is made uniform in the surface of the silicon substrate. It is important and more preferable to perform the adjustment such that the concentration is made uniform when the formation of the film is completed. In such a manner, uniform plasma doping can be realized with good repeatability. When the shape of the inner wall of the vacuum chamber is adjusted such that the distribution of the dose of the impurity is made uniform before the film is formed or when the film is being formed, since the state of the inner wall of the vacuum chamber, that is, the state of the film, is changed while plasma doping is repeated, it is difficult to reproduce uniformity.

The plasma doping method according to the aspect of the invention may further include a step of adjusting a gas supply method such that the amount of an impurity to be stuck to the inner wall of the vacuum chamber has a desired value.

For example, a film containing an impurity having a dark color, that is, a large thickness is likely to be formed in the vicinity of a gas jetting port. For this reason, the dose becomes large in a portion near the gas jetting port and becomes small in a portion distant from the gas jetting port. Accordingly, in-plane uniformity of the dose can be improved by adjusting the gas jetting port and the semiconductor substrate. For example, in-plane uniformity can be improved by moving, for example, rotating the semiconductor substrate with respect to the gas jetting port.

In the plasma doping method according to the aspect of the invention, the maintenance step may include a substep of providing the vacuum chamber, from which the film containing the impurity is removed, in a plasma doping apparatus and then generating the plasma containing the impurity ions in the vacuum chamber so as to form the film containing the impurity ions.

According to this configuration, a high-accurate impurity profile can be obtained with good controllability without using a special device.

In the plasma doping method according to the aspect of the invention, the step of forming the film containing the impurity ions may provide the vacuum chamber, from which the film containing the impurity is removed in the maintenance step, in a plasma doping apparatus separately provided in order to form the film and may generate the plasma containing the impurity ions in the vacuum chamber so as to form the film containing the impurity ions.

According to this configuration, desired control is performed using an additional device, and thus a high-accurate impurity profile can be obtained with good controllability.

The plasma doping method according to the aspect of the invention may further include a step of doping the impurity into the sample by sputtering from the film containing the impurity fixed to the inner wall of the vacuum chamber while measuring and managing a temperature of the inner wall of the vacuum chamber.

With this configuration, it has been found that the amount of the impurity to be doped from the film containing the impurity into the semiconductor substrate is changed by the temperature of the inner wall of the vacuum chamber. Accordingly, in order to keep the amount of the impurity constant, it is preferable to keep the temperature of the inner wall of the vacuum chamber constant. Further, in order to set the amount of the impurity to be doped from the film to a desired value, it is preferable to adjust the temperature of the inner wall of the vacuum chamber to a desired temperature.

Moreover, in the invention, a dummy chamber may be disposed in the vacuum chamber to cover the inner wall, and a film may be formed on the inner wall of the vacuum chamber. In vacuum equipment, there are many cases where the dummy chamber is called an inner chamber. In the invention, the formation of the film on the inner wall of the vacuum chamber, the studies of the shape of the inner wall, or the management of the temperature has been described. However, as for the inner chamber, the same effects can be obtained through the same studies. Therefore, the inner chamber still falls within the scope of the invention. In addition, the inner chamber does not have a function of holding the vacuum state, but can be simply detached, easily cleaned, and used as consumption goods. Accordingly, when the inner chamber is provided, it is desirable in that, instead of detaching and cleaning an expensive vacuum chamber, only the inner chamber can be detached and cleaned.

In the plasma doping method according to the aspect of the invention, the plasma may be plasma of gas containing boron.

According to this configuration, the boron film can be formed on the inner wall of the vacuum chamber. In addition, it is configured such that, when the film containing the impurity fixed to the inner wall of the vacuum chamber is attacked by the ions in the plasma, the amount of the impurity to be doped into the surface of the sample by sputtering is not changed even though the plasma containing the impurity ions are repeatedly generated in the vacuum chamber. Therefore, a high-accurate impurity profile can be obtained with good controllability, together with the impurity by sputtering.

In the plasma doping method according to the aspect of the invention, the gas containing boron may be gas of molecules having boron and hydrogen.

As the gas, $BF_3$ or the like may be used, but, since F has a high sputter rate, it is difficult form a stable film. In order to form the stable film, gas having an atom having a low sputter rate is preferably used. In addition, if the sputter rate is high, the surface of the silicon substrate may be chipped off during the plasma doping treatment, a device cannot be manufactured according to design. Further, since the surface of the silicon substrate doped with the impurity is chipped off, impurity doping itself may not be performed with good controllability. Since hydrogen has a sputter rate less than F, if the gas of molecules having boron and hydrogen is used, a high-accurate impurity profile can be obtained with good controllability.

In the plasma doping method according to the aspect of the invention, the gas containing boron may be diborane ($B_2H_6$).

According to this configuration, $B_2H_6$ is industrially cheap, and is filled in a gas tank to be then transported and preserved in a gas state, which results in ease of handling. In addition, since only boron and hydrogen are contained, a sputter rate is low, and thus a high-accurate impurity profile can be obtained with good controllability.

In the plasma doping method according to the aspect of the invention, the plasma may be plasma of gas that is obtained by diluting gas of molecules having boron and hydrogen with rare gas.

According to this configuration, if the concentration of the gas containing boron is excessively high, the film may be easily separated. If the film is separated, particles may be generated to cause degradation of yield in manufacturing a semiconductor, which causes an inconvenience. Accordingly, if the gas concentration is lowered through the dilution with a different gas, a film that is rarely separated can be formed. As the dilution gas, rare gas having chemical stability is preferably used.

In the plasma doping method according to the aspect of the invention, the rare gas may be an atom having an atomic weight equal to or less than neon.

Among the rare gases, rare gas having a large atomic weight has a high sputter rate, and thus it is difficult to form a stable film. Further, it may chip off the surface of the silicon substrate. Therefore, the rare gas having an atomic weight smaller than neon is preferably used.

In the plasma doping method according to the aspect of the invention, the rare gas may be helium. In particular, helium has the smallest atomic weight and the lowest sputter rate among the rare gases. Therefore, a stable film is easily formed, and chipping of the silicon substrate can be suppressed to the minimum.

In the plasma doping method according to the aspect of the invention, the plasma may be plasma of gas that is obtained by diluting diborane ($B_2H_6$) with helium.

It is most preferable to use the gas diluted with helium such that the gas concentration of $B_2H_6$ becomes low.

In the plasma doping method according to the aspect of the invention, an implantation depth of boron may be in a range of 7.5 mm to 15.5 mm.

From the experiment result, if implantation energy corresponding to the implantation depth of boron ranging from 7.5 nm to 15.5 nm is used, it can be seen that a film containing boron is formed on the inner wall of the vacuum chamber such that sheet resistance is saturated. In addition, it can be seen that, when the formation of the film is completed, good in-plane uniformity is obtained.

In the plasma doping method according to the aspect of the invention, an implantation depth of boron may be equal to or less than 10 nm.

Under a low energy condition corresponding to the implantation depth of boron equal to or less than 10 nm, it is very difficult to obtain uniformity. However, from the experiment result, it can be seen that, according to the method of the invention, uniformity of 1.5% or less can be realized by adjusting the PD time.

In the plasma doping method according to the aspect of the invention, the plasma may use continuous plasma.

According to this configuration, uniformity of 1.5% or less can be realized by adjusting the PD time using the continuous plasma. In general, in plasma doping, there are developed a technology using continuous plasma and a technology using pulse plasma. When the pulse plasma is used, it has been reported that, in an implantation technology for a deep region more than approximately 20 nm, not the implantation to a shallow region as intended in the invention, uniformity and reproducibility are secured by plasma doping. However, as for the implantation into the shallow region, uniformity and reproducibility are insufficient. In contrast, in the invention, from various experiment results, in case of the implantation into the shallow region by the continuous plasma, uniformity and reproducibility can be secured.

According to another aspect of the invention, a plasma doping apparatus that performs the above-described plasma doping method includes a vacuum chamber, a sample electrode, a gas supply device that supplies gas into the vacuum chamber, an exhaust device that exhausts the vacuum chamber, a pressure control device that controls a pressure in the vacuum chamber, and a power supply for a sample electrode that supplies power to the sample electrode.

With this configuration, reproducibility of the dose of boron doped by plasma doping can be secured through the pressure control using the pressure control device.

The plasma doping apparatus according to another aspect of the invention may further include a plasma generation device that forms the film containing the impurity.

With this configuration, the state of the inner wall of the vacuum chamber can be easily controlled.

The plasma doping apparatus according to another aspect of the invention may further include a mechanism that adjusts a flow distribution of the gas to be supplied to the vacuum chamber such that the flow distribution of the gas can be adjusted after the film containing the impurity is formed, without exposing the inner wall of the vacuum chamber to atmosphere.

With this configuration, a desired internal state can be easily obtained in a short time without using an additional device and separately providing a preparation time forming the vacuum.

The plasma doping apparatus according to another aspect of the invention may further include a mechanism that adjusts a temperature of the inner wall of the vacuum chamber to a desired temperature.

The temperature control of the inner wall of the vacuum chamber can be realized by measuring the temperature using a temperature sensor and heating the inner wall using a heater. According to the experiment of the inventors, if the experiment is performed with no temperature control, the temperature of the inner wall of the vacuum chamber is initially at a room temperature, but it is increased to 40° C. to 90° C. when the plasma doping treatment is repeated. The increased temperature depends on the number of processing times or the conditions. Then, if the plasma doping treatment ends, the temperature is gradually decreased to the room temperature. That is, the temperature varies when the plasma doping treatment starts and when the plasma doping treatment is repeated. In addition, the temperature of the inner wall of the vacuum chamber is affected by a difference from an external temperature. Accordingly, it is preferable to adjust the temperature of the inner wall to a temperature that the inner wall naturally reaches when the plasma doping treatment is repeated, for example, a desired temperature of 40° C. to 90° C. Therefore, the amount of the impurity to be doped from the film can be adjusted to a desired value. Further, it is more preferable to adjust the temperature of the inner wall to a desired temperature 50° C. to 70° C. As a result, since the adjustment to a temperature that the inner wall naturally reaches under more plasma doping conditions can be performed, good repeatability can be obtained.

According to still another aspect of the invention, there is provided a silicon substrate that has a diameter 300 mm and into a surface of which boron is doped by plasma doping using continuous plasma containing boron. In this case, a profile of doped boron has a depth ranging 7 nm to 15.5 nm with a boron concentration of $5 \times 10^{18}$ cm$^{-3}$, steepness of the depth profile of boron is in a range of 1.5 nm/dec 3 nm/dec upon evaluation at a distance where the boron concentration is lowered from $1 \times 10^{19}$ cm$^{-3}$ to $1 \times 10^{18}$ cm$^{-3}$, and a dose of boron has a standard deviation of 2% or less at a surface excluding an end 3 mm of the silicon substrate. Among many products that can be manufactured using the method according to the invention, when the above-described substrate is manufactured, the following marked effects can be obtained. If boron is doped at the depth of the above range, a very fine source-to-drain extension electrode of a MOSFET of a 65 nm node to 22 nm node can be formed. Further, when boron is doped at the steepness of the above range, a very fin drain current of the MOSFET can be increased. When boron is doped by plasma doping, the very fine electrode of the MOSFET can be produced with good productivity. In addition, since in-plane uniformity of the dose can be improved by the 300 mm substrate, productivity and yield can be improved. Moreover, this is verified by way of the example using a silicon substrate as the semiconductor substrate. A germanium substrate or a strained silicon substrate may be used since an atom used in the germanium substrate or the strained silicon substrate has an atomic weight not different only negligibly from the silicon atom and thus it can be supposed that the same effects are obtained.

BRIEF DESCRIPTION OF THE DRAWINGS

FIG. 13 is a diagram showing the comparison result between uniformity of a plasma doping region obtained by an example of the invention and uniformity of a plasma doping region obtained by a comparative example;

DESCRIPTION OF THE PREFERRED EMBODIMENTS

Hereinafter, embodiments of the invention will be described with reference to the drawings.

First Embodiment

Hereinafter, a first embodiment of the invention will be described in detail with reference to the drawings.

Figure 14:
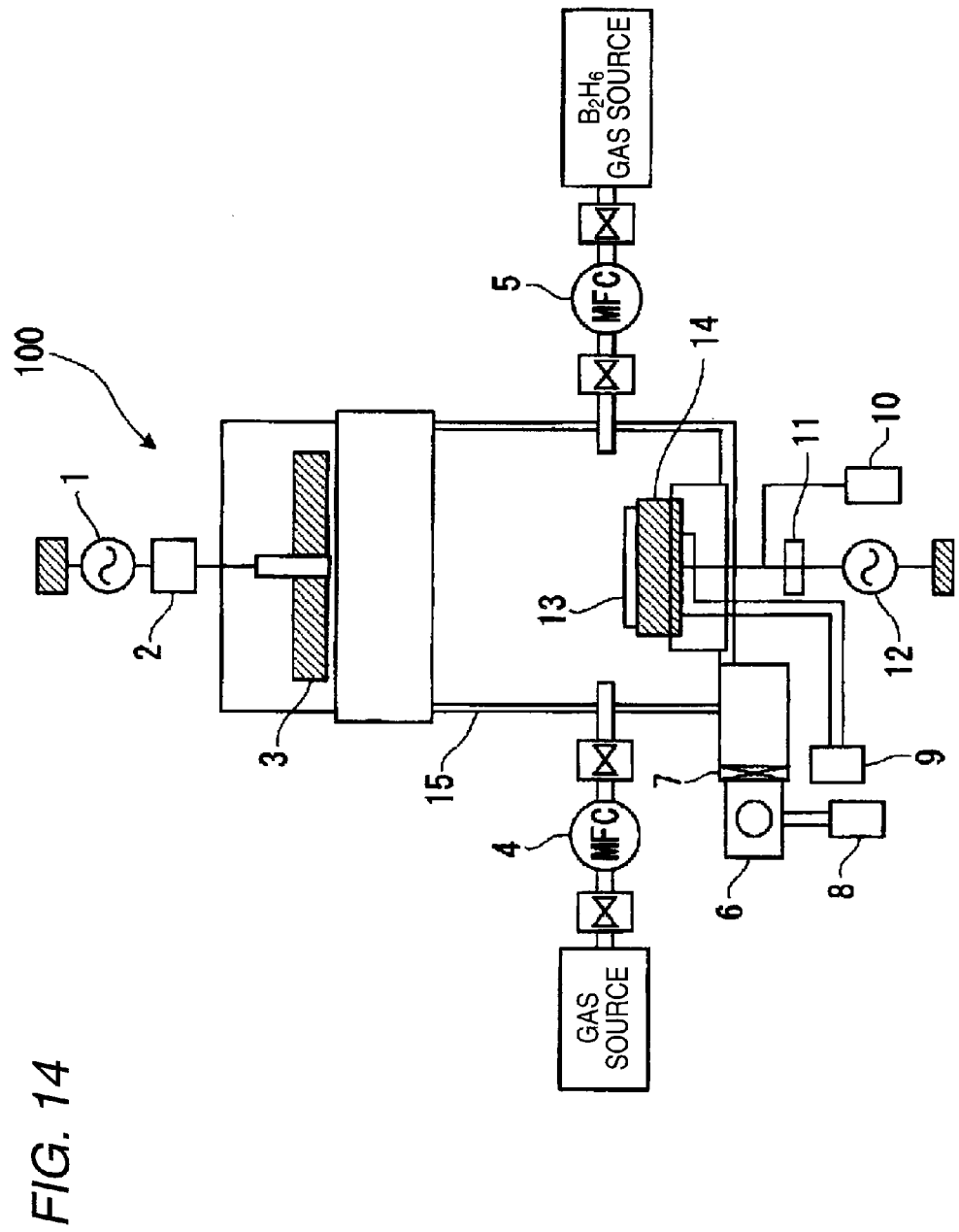
FIG. 14 is a diagram showing a plasma doping apparatus according to a first embodiment of the invention.

FIG. 14 is a cross-sectional view of a plasma doping apparatus that is used in the embodiment of the invention.

The plasma doping apparatus includes a vacuum chamber 15 that has a film containing an impurity formed on an inner wall thereof, a turbo molecular pump 6 that serves as an exhaust device for exhausting the vacuum chamber 15, a pressure regulating valve 7 that serves as a pressure control device for controlling a pressure in the vacuum chamber 15, a coil and antenna 3 that serves as a plasma source provided in the vicinity of a dielectric window facing a lower electrode 14, a high-frequency power supply 12 that supplies high-frequency power of 13.56 MHz to the coil and antenna 3, and a high-frequency power supply 1 that serves as a voltage source for supplying a voltage to the lower electrode 14. In the plasma doping apparatus, a substrate to be processed (substrate) 13 is placed on the lower electrode 14 serving as a sample table, and plasma irradiation is performed onto the substrate 13.

Here, a high frequency is supplied from the coil and antenna 3 through the high-frequency power supply 1 for generating plasma and the matching box 2 for adjusting the discharge. Required gas is supplied through the mass flow controllers (MFC) 4 and 5. A degree of vacuum in the vacuum chamber 15 is controlled by the mass flow controllers 4 and 5, the turbo molecular pump 6, the pressure regulating valve 7, and the dry pump 8. Power is supplied to the vacuum chamber 15 from the high-frequency power supply 12 through the matching box 11. The substrate 13 to be processed that is provided in the vacuum chamber 15 is placed on the sample table 14, and then the power is supplied.

Next, a plasma doping process will be described.

A predetermined gas is introduced from the gas supply device into the vacuum chamber 15 of the process chamber through the mass flow controllers 4 and 5, while gas exhaust is performed by the turbo molecular pump 6 as an exhaust device. Further, the vacuum chamber 15 is kept at a predetermined pressure by the pressure regulating valve 7 as a pressure control device. Then, high-frequency power of 13.56 MHz is supplied from the high-frequency power supply 1 to the coil 3 as a plasma source, such that inductively coupled plasma is generated in the vacuum chamber 15. In this state, the silicon substrate 13 as a sample is placed on the lower electrode 14. Further, high-frequency power is supplied by the high-frequency power supply 12, and then the potential of the lower electrode 14 can be controlled such that the silicon substrate (the substrate to be processed) 13 as a sample has a negative potential with respect to plasma.

First, plasma of gas containing an impurity is generated in the vacuum chamber so as to form a film. For example, plasma doping may be repeatedly performed on a dummy substrate under a constant plasma doping condition. As the film is formed, the film is attacked by ions in the plasma, and the amount of an impurity to be doped into the surface of the silicon substrate by sputtering is increased.

The increase reaches the saturation before long, and, under the constant plasma doping condition, a dose of the impurity to be doped by the plasma doping treatment one time is made uniform even when plasma doping is repeated. For example, if doping is performed on the silicon substrate multiple times under the constant plasma doping condition, and the dose into the silicon substrate is made uniform, it can be seen that the formation of the film is completed. If the first dose to the substrate tends to be smaller the final dose to the substrate, the formation of the film is not completed, and thus the formation of the film is continued.

The shape of the inner wall of the vacuum chamber is adjusted such that, when the formation of the film is completed, the total distribution of the distribution of the impurity to be doped from the plasma containing the impurity ions and the distribution of the impurity to be doped by sputtering from the film containing the impurity fixed to the inner wall of the vacuum chamber is made uniform in the surface of the silicon substrate.

It is important and more preferable to perform the adjustment such that the distribution is made uniform when the formation of the film is completed. In such a manner, uniform plasma doping can be realized with good repeatability. When the shape of the inner wall of the vacuum chamber is adjusted such that the distribution of the dose of the impurity is made uniform before the film is formed or when the film is being formed, since the state of the inner wall of the vacuum chamber, that is, the state of the film, is changed while the plasma doping treatment is repeated, it is difficult to reproduce uniformity.

After the silicon substrate 13 is placed on the sample table 14 as the lower electrode, while the vacuum chamber 15 is exhausted, helium gas is supplied into the vacuum chamber 15 by the mass flow controller 4 and diborane ($B_2H_6$) gas as doping material gas is supplied into the vacuum chamber 15 by the mass flow controller 5. At this time, the pressure regulating valve 7 is controlled such that the pressure of the vacuum chamber 15 is kept at 0.9 Pa. Next, high-frequency power 1500 W is supplied to the coil 3 as a plasma source so as to generate plasma in the vacuum chamber 15. Further, high-frequency power 200 W is supplied to the lower electrode 14 such that boron is implanted in the vicinity of the surface of the silicon substrate 13. Here, plasma that is exposed to the silicon substrate 13 is mixture gas plasma of $B_2H_6$ and He ($B_2H_6$/He plasma). Moreover, the mixture ratio of $B_2H_6$ and He can be changed by changing a ratio of flow rates of He gas and $B_2H_6$ gas flowing in the mass flow controllers 4 and 5.

If a bias is applied by irradiating the mixture gas plasma of $B_2H_6$ and He ($B_2H_6$/He plasma) onto the silicon substrate, there is a time when doping and sputtering of boron to the silicon substrate are saturated (balanced). That is, if plasma irradiation starts, the dose is initially increased, and thereafter, a time when the dose is substantially uniform without depending on the time variation is continued. Accordingly, the dose can be accurately controlled through a process window of the time when the dose is made substantially uniform without depending on the time variation. Further, in-plane uniformity can be obtained by previously measuring, in the surface of the silicon substrate, the time when the dose is made uniform and setting the doping time according to the latest start time.

The film containing the impurity may be formed after the vacuum chamber is mounted after the maintenance of the plasma doping apparatus. After the film is formed, the impurity is doped under an actual plasma doping condition. In such a manner, a process can be performed while the formed film is not exposed to atmosphere. In case of the boron film, boron tends to act with moisture. Accordingly, it is preferable to use the above-described configuration since, according to the above-described configuration, the film can be formed without acting with moisture and then used in the process.

The film containing the impurity may be formed by providing a vacuum chamber, from which the film containing the impurity is removed through a maintenance step, in a plasma generation device separately prepared in order to form the film, and generating the plasma containing the impurity ions in the vacuum chamber. If a plurality of vacuum chambers are prepared, the vacuum chamber to which the film is attached in advance may be provided in the plasma doping apparatus, thereby performing the plasma doping treatment, while the film is being attached by the plasma generation device separately prepared. Accordingly, while the film is being attached to the inner wall of the vacuum chamber, the plasma doping treatment can be performed on the silicon substrate, thereby improving productivity.

EXAMPLE 1

Example 1 of the invention will be described. Moreover, when there is not particular description, the following experiment method is common to the individual examples. First, using the plasma doping apparatus shown in FIG. 14, a boron film is formed in the vacuum chamber using mixture gas plasma of $B_2H_6$ and He. The plasma doping apparatus used herein is an apparatus that is typically used. As the PD conditions, the gas mixture ratios of $B_2H_6$ and He are 0.05% and 99.95%, source power is 1500 W, bias power is 135 W, and a pressure is 0.9 Pa. A plasma doping time when a bias is applied is 60 seconds. Under the constant conditions, plasma doping is performed on a substrate having a diameter 300 mm in the vacuum chamber immediately after the maintenance. Then, a heat treatment is performed on the first, 25-th, 75-th, 125-th, 250-th, and 500-th processed silicon substrates at 1075° C. for 20 seconds. Thereafter, sheet resistance at 121 places excluding an end 3 mm of the substrate are measured by a four-probe method, and a standard deviation with respect to the average value of sheet resistance is calculated. In-plane uniformity is represented by the standard deviation (1σ) of sheet resistance. At this time, the reason why the heat treatment is not performed on the second to 24-th substrates is that the treatment is performed using a dummy silicon substrate. The dummy silicon substrate means that, an actual silicon substrate is used, but a new substrate is not used for each PD treatment and the PD treatment is repeatedly performed on the same silicon substrate approximately one hundred times. This is a measure that saves consumption of the silicon substrate without having an affect on the experiment for forming the film containing boron on the inner wall of the vacuum chamber.

Figure 1:
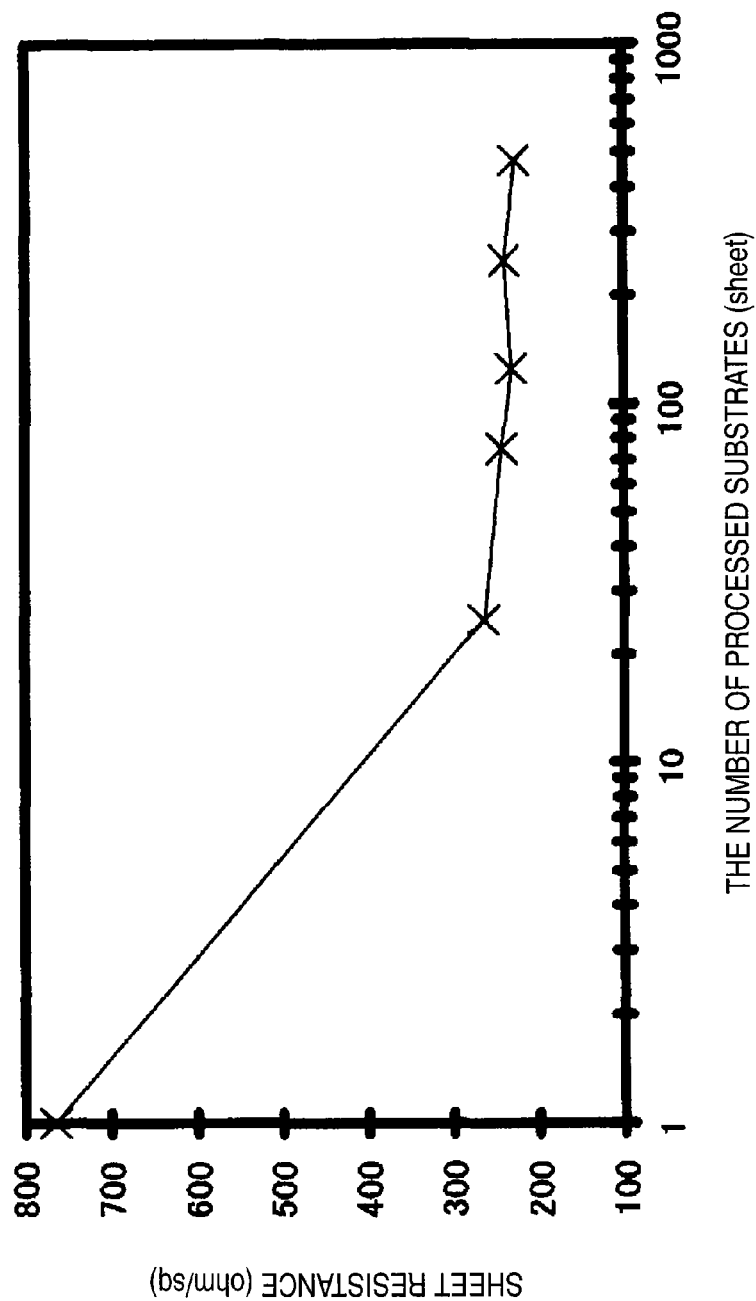
FIG. 1 is a diagram showing the relationship between the number of substrates subjected to plasma doping and sheet resistance.

FIG. 1 shows the relationship between the number of substrates subjected to the plasma doping treatment and sheet resistance. Even though the treatment is performed under the same condition, sheet resistance is initially high and then gradually decreased as the number of processed substrates increases. As the analysis result of the film formed on the inner wall of the vacuum chamber after the experiment, it can be seen that boron is contained in the film. It is considered that the film is formed while the PD treatment is repeated and then sheet resistance is decreased.

Figure 2:
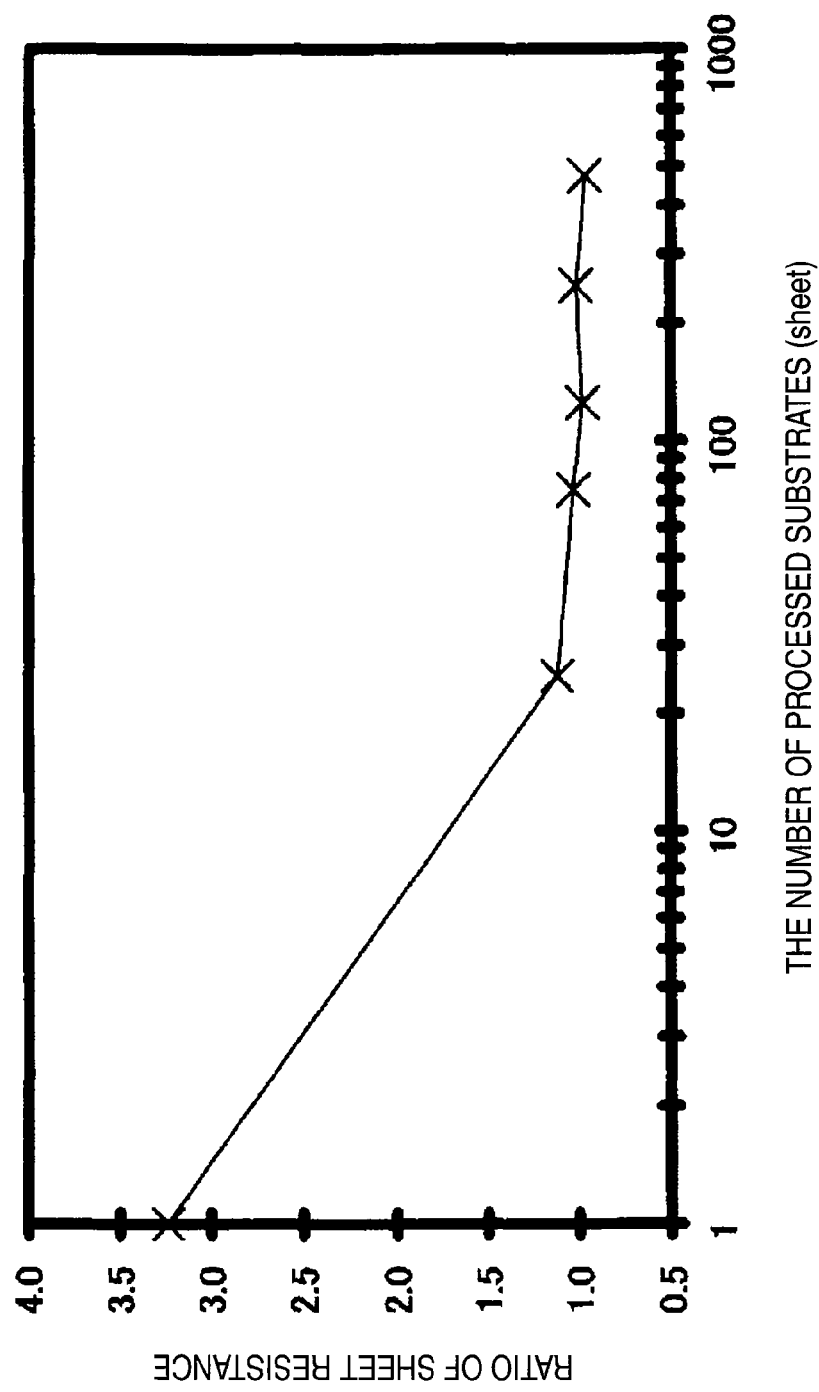
FIG. 2 is a diagram showing repetitive reproducibility of sheet resistance (a ratio of sheet resistance ranges from 0.5 to 4.0)
Figure 3:
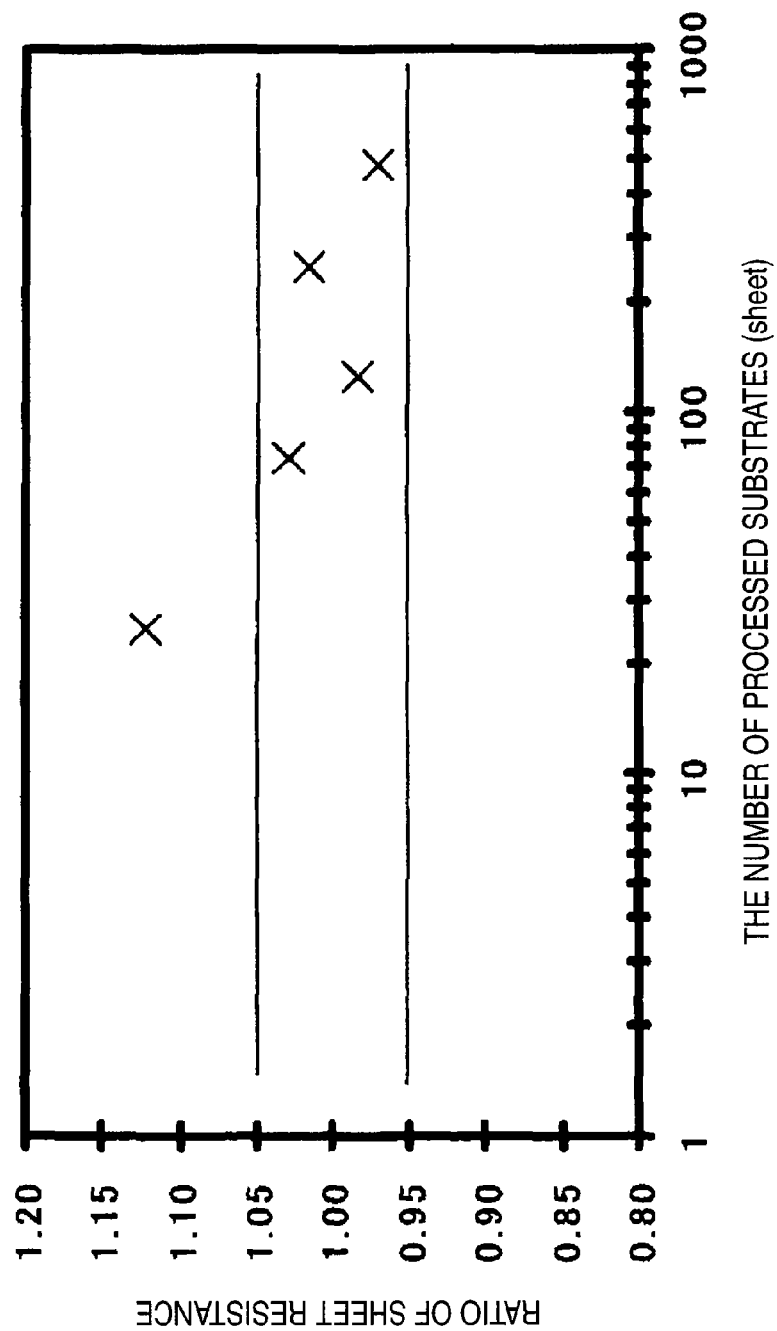
FIG. 3 is a diagram showing repetitive reproducibility of sheet resistance (a ratio of sheet resistance ranges from 0.8 to 1.2)

The average value of sheet resistance of the 75-th, 125-th, 250-th, and 500-th processed substrates is 236.1 ohm/sq. FIGS. 2 and 3 are diagrams having a ratio of sheet resistance when 236.1 ohm/sq is substituted with '1' as a vertical axis and the number of substrates subjected to the PD treatment as a horizontal axis. FIG. 3 shows the ratio of sheet resistance ranging from 0.8 to 1.2. Referring to FIG. 3, the decrease of sheet resistance is not saturated, that is, the formation of the film is not saturated, in case of the 25-th processed substrate. However, in case of the 75-th substrate or later, sheet resistance is converged on a variation within a tolerance of ±5%, and the decrease of sheet resistance is saturated. That is, it can be seen that the formation of the film is saturated at the time of the PD treatment on the 75-th substrate. After the formation of the film is completed, while sheet resistance varies around the average value within a small range, the PD treatment can be performed continuously many times.

Referring to FIG. 2, sheet resistance of the first substrate subjected to the PD treatment is approximately 3.2 times as much as average sheet resistance (236.1 ohm/sq) of the 75-th substrate and later. It is possible to consider that the dose is substantially in proportion to sheet resistance. Accordingly, it means that the dose to the first substrate is only approximately 30% of the dose to the 75-th substrate or later. In case of the first substrate, a factor that boron is doped entirely depends on $B_2H_6$ gas plasma introduced in forms of gas, ions, and radicals through the plarmization of boron contained in $B_2H_6$ gas introduced from the gas introduction port. At this time, since the film containing boron is not formed, the dose from the film is zero. Meanwhile, after the 75-th substrate or later, a factor depends on the film containing boron formed on the inner wall of the vacuum chamber, in addition to the $B_2H_6$ gas plasma. Since the PD condition is unchanged for the first substrate or the 75-th substrate, the dose from the $B_2H_6$ gas plasma is not changed. The changed is the dose from the film. Table 1 shows the dose of the first substrate and the 75-th substrate and later by factors. It can be seen that, after the 75-th substrate and later, the dose from the film containing boron becomes a principal factor at approximately 70%. The dose from the $B_2H_6$ gas plasma occupies only approximately 30%. This is a new fact that reverses the concept of plasma doping in the related art. From this, it has been found that, in order to obtain in-plane uniformity of the dose by plasma doping and repeatability, it is important to focus the dose from the film containing boron. In addition, it has been found that it is important and preferable to make the dose from the film uniform in the surface of the semiconductor substrate, to improve repetitive reproducibility, and to perform the adjustment to a desired dose.

TABLE 1

|  | Sheet Resistance (ohm/sq) | Ratio of Dose | Dose from $B_2H_6$ Gas Plasma (Normalization with Dose of First Substrate) | Dose from Film Containing Boron (Normalization with Dose of First Substrate) |
| --- | --- | --- | --- | --- |
| First Substrate (Comparative Example) | 756 | 1 | 1 | 0 |
| 75-th Substrate and Later (Example) | 236.1 | 3.2 | 1 | 2.2 |

Figure 4:
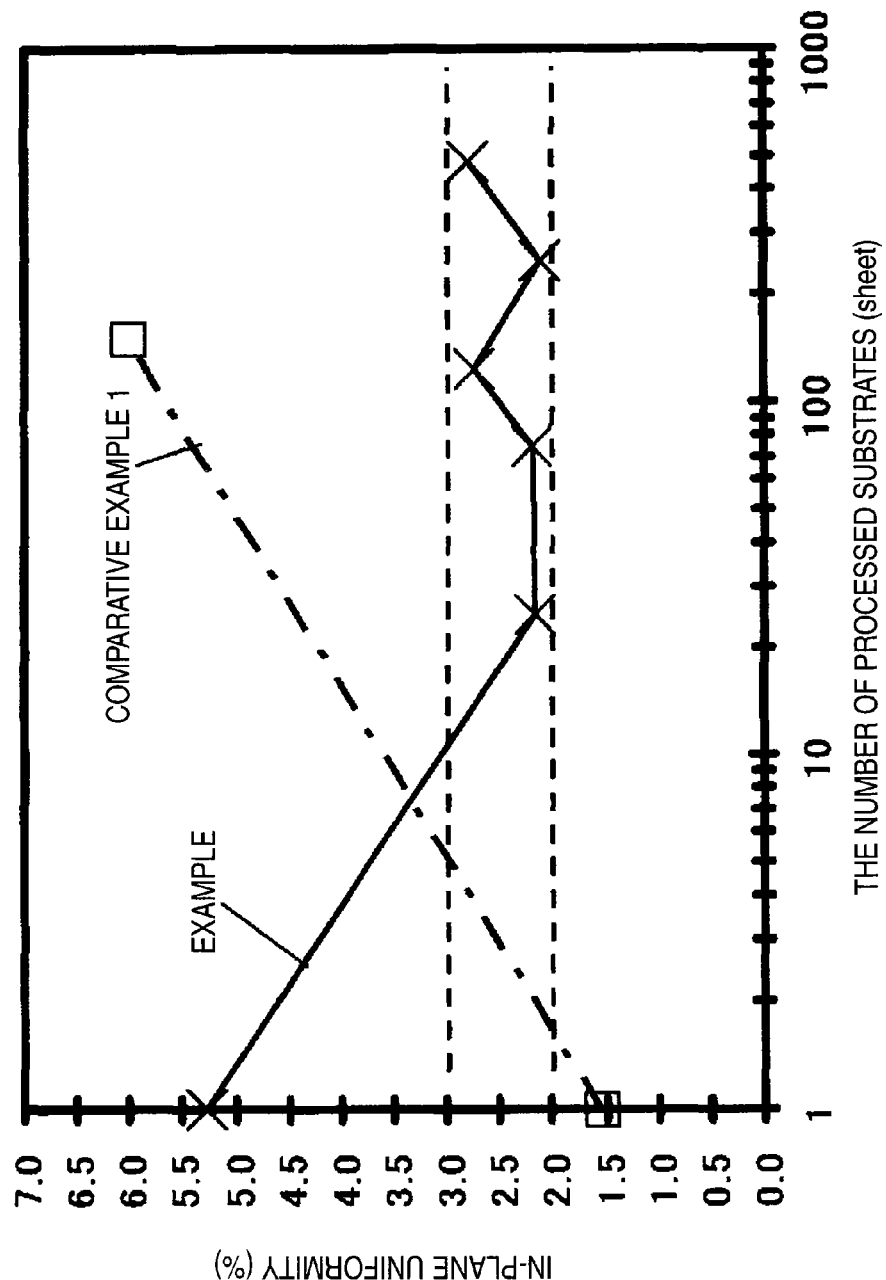
FIG. 4 is a diagram showing repetitive reproducibility of in-plane uniformity.

FIG. 4 shows the relationship between the number of substrates subjected to the plasma doping treatment and in-plane uniformity of sheet resistance. It can be seen that the in-plane uniformity is improved from 5.28% in the first substrate to a range of 2% to 3% in the 25-th substrate and later. This is because the shape of the inner wall of the vacuum chamber is adjusted such that the in-plane uniformity is improved when the formation of the film is completed. In the related art, the shape of the vacuum chamber or the position of the coil is adjusted so as to make the plasma or gas distribution uniform. This corresponds to a case where the maximum in-plane uniformity is obtained in the first substrate. However, in this example, the in-plane uniformity is neglected since the film is not completely formed, and the shape of the inner wall of the vacuum chamber is adjusted while focusing on the state when the formation of the film is completed. As a result, the 25-th substrate and later when the film is being formed has in-plane uniformity superior to the first substrate. Further, in the 75-th substrate and later when the formation of the film is completed, markedly improved in-plane uniformity with respect to the first substrate can be continuously realized with good repetitive reproducibility.

On the basis of the experiment result, the plasma doping apparatus, in which the shape of the inner wall of the vacuum chamber after the maintenance is adjusted in advance such that in-plane uniformity is improved when the formation of the film is completed, is prepared, and plasma doping is performed. In particular, it is preferable to adjust the shape of a side surface and a top surface in the inner wall of the vacuum chamber. Specifically, a chamber serving as an inner wall is provided in the vacuum chamber. This chamber cannot be kept in a vacuum state. This chamber is used to form a film on its surface. With this chamber, it is unnecessary to clean the entire vacuum chamber upon the maintenance, and only the above-described chamber may be removed and cleaned. If a plurality of chambers are prepared, while one chamber is cleaned, production can be continued using another chamber, and thus efficiency can be improved. In addition, the above-described chamber does not have a vacuum keeping capability compared with the vacuum chamber, and thus the structure can be simplified, and cleaning can be easily performed.

Figure 5:
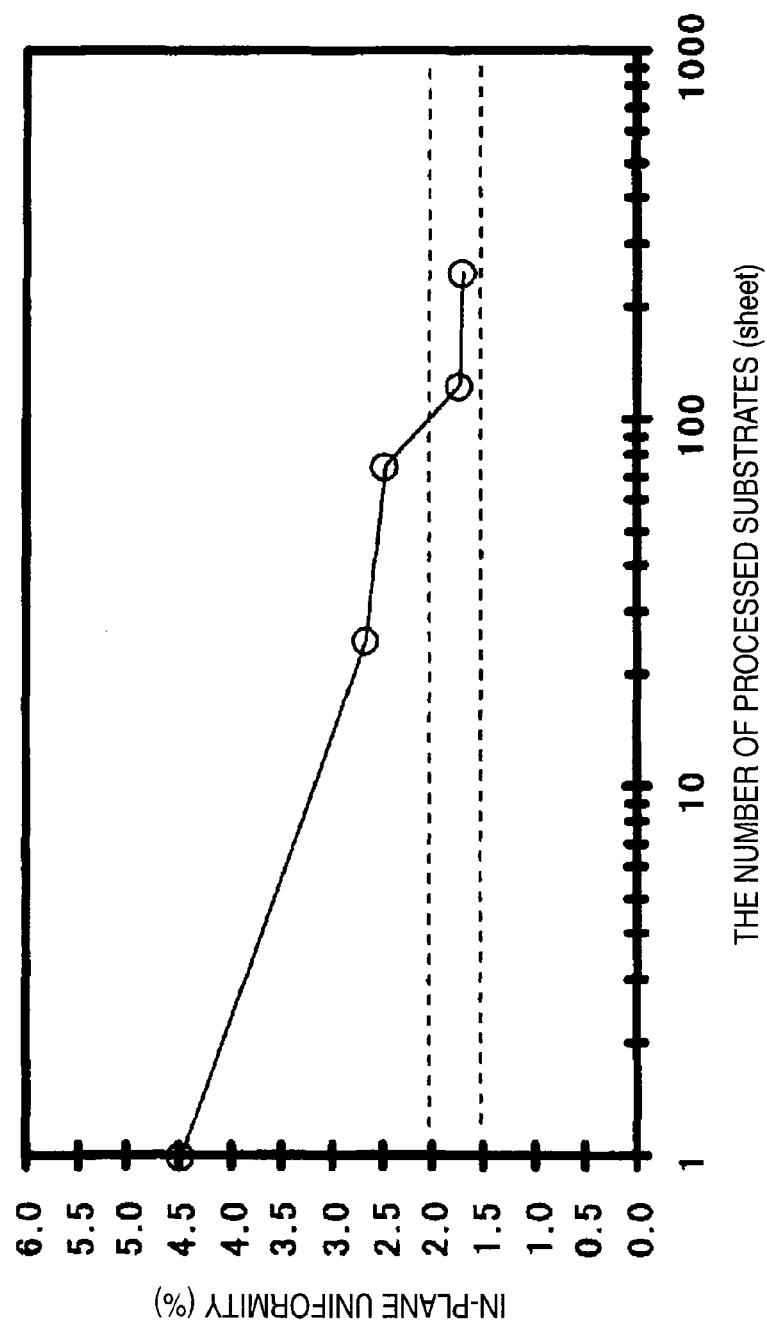
FIG. 5 is a diagram showing repetitive reproducibility of in-plane uniformity.

The shape of the chamber has been studied as follows. The chamber is substantially symmetric as viewed from the center of the silicon substrate. However, it is necessary to form an opening, through which a transfer arm for transferring the silicon substrate into the vacuum chamber enters and leaves the vacuum chamber. At this portion, symmetry is drastically lacking. Accordingly, in order to keep symmetry as much as possible, the inventors have studied for making the area of the opening as small as possible to an extent such that the silicon substrate and the transfer arm get therethrough. As a result, as shown in FIG. 5, in the PD treatment of the 100-th substrate and later when the formation of the film is completed, very good uniformity of 2% or less is obtained.

Figure 15:
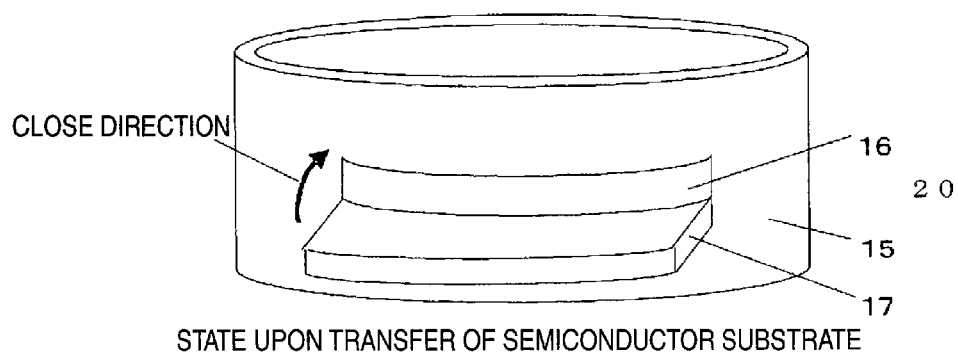
FIG. 15 is a diagram showing a chamber provided in a vacuum chamber and a cover closing an opening for a transfer arm according to the invention.
Figure 15:
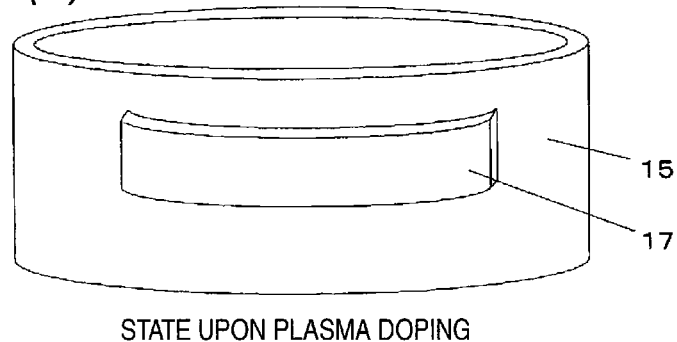

Although the area of the opening is made small herein, when plasma doping is performed, a mechanism that covers the opening may be provided to close the opening, and the film may be formed after the opening is covered. In this case, symmetry is further increased. As a mechanism 20 that covers the opening 16, a plate-shaped cover 17 may be fixed from the outside of the chamber 15, as shown in FIG. 15. As a simple structure, a driving unit may be provided outside the chamber, and thus the opening may be covered without causing particles. FIG. 15(a) is a diagram showing when a semiconductor substrate is transferred. FIG. 15(b) is a diagram showing a state where plasma doping is performed.

On the basis of the experiment result, in order to improve the in-plane uniformity when the formation of the film is completed, a plasma doping apparatus, in which a gas supply method is adjusted in advance immediately after the maintenance, is prepared, and plasma doping is performed. As the gas supply method, a head plate is disposed to the silicon substrate, 18 holes are opened in the head plate like a shower head, and gas is supplied from the holes into the vacuum chamber. Then, the positions of the holes are adjusted such that the in-plane uniformity is improved when the formation of the film is completed. The plasma doping apparatus used herein is shown in FIG. 16.

Figure 16:
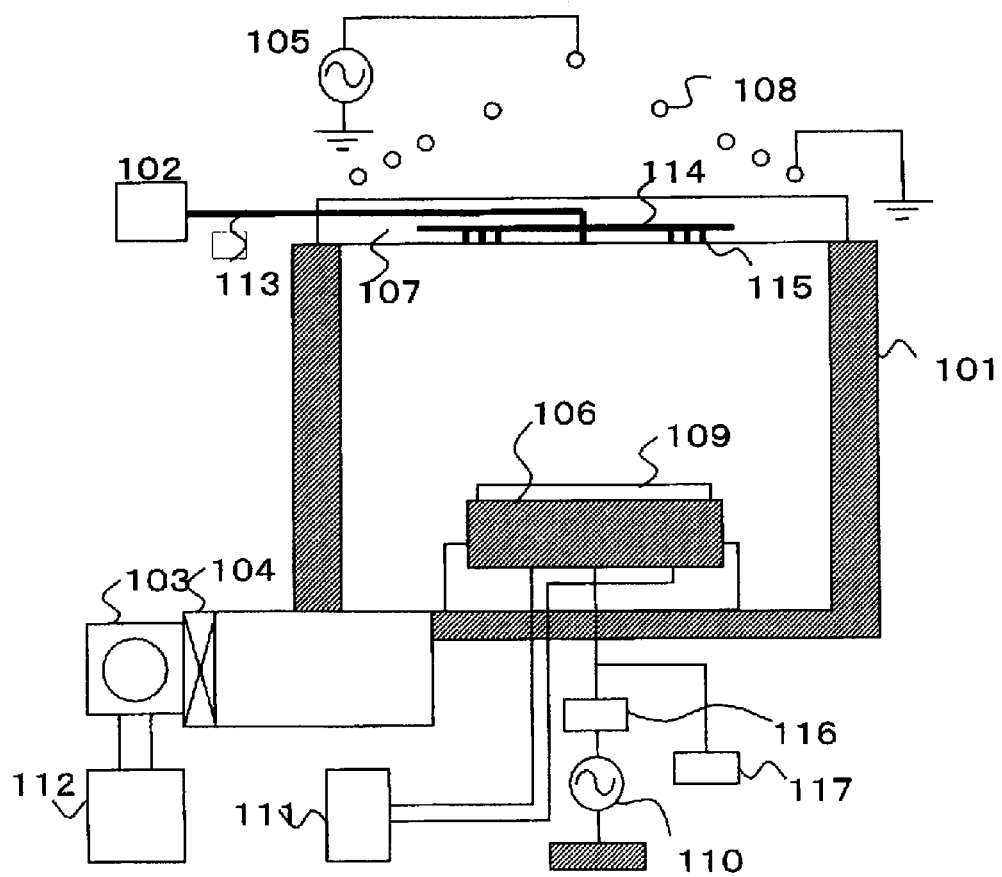
FIG. 16 is a diagram showing a plasma doping apparatus used for comparison of uniformity in the first embodiment of the invention.

In FIG. 16, a predetermined gas is introduced from a gas supply device 102 into a vacuum chamber 101 while gas exhaust is performed by a turbo molecular pump 103 as an exhaust device. The vacuum chamber 101 can be kept at a predetermined pressure by the pressure regulating valve 4. Then, high-frequency power of 13.56 MHz is supplied to a coil 108 provided in the vicinity of a dielectric window 107 facing a sample electrode 106 by a high-frequency power supply 105, such that inductively coupled plasma can be generated in the vacuum chamber 101. A silicon substrate 109 as a sample is placed on the sample electrode 106. Further, a high-frequency power supply 110 that supplies high-frequency power to the sample electrode 106 is provided. The high-frequency power supply 110 functions as a voltage source for controlling the potential of the sample electrode 106 such that the substrate 109 as the sample has a negative potential with respect to the plasma. In such a manner, ions in the plasma are accelerated and collide against the surface of the sample, such that the impurity can be doped into the surface of the sample. Moreover, the gas supplied from the gas supply device 102 is exhausted from an exhaust port 111 to the pump 103.

A flow rate of gas containing impurity material gas is controlled to a desired value by a flow rate control device (mass flow controller) provided in the gas supply device 102. In general, gas obtained by diluting the impurity material gas with helium, for example, gas obtained by diluting diborane ($B_2H_6$) with helium (He) at 0.5% is used as impurity material gas, and the flow rate of the impurity material gas is controlled by a first mass flow controller. Further, the flow rate of helium is controlled by a second mass flow controller. The gases whose flow rates are controlled by the first and second mass flow controllers are mixed in the gas supply device 102, and then introduced to a gas main path 114 through a pipe (gas introduction path) 113. Subsequently, the mixture gas is introduced into the vacuum chamber 101 by gas outlet ports 115 through a plurality of holes connected to the gas main path. The plurality of gas outlet ports 115 are configured to blow off the gas from a surface facing the sample 109 toward the sample 109.

The gas outlet ports 115 are substantially provided symmetrically with respect to the center of the dielectric window 107. The gas outlet ports 115 have a structure to substantially isotropically blow off the gas toward the sample. That is, 24 gas outlet ports 115 are substantially isotropically arranged. Reference numeral 116 denotes a matching box, and reference numeral 117 denotes a VDC monitor.

Figure 6:
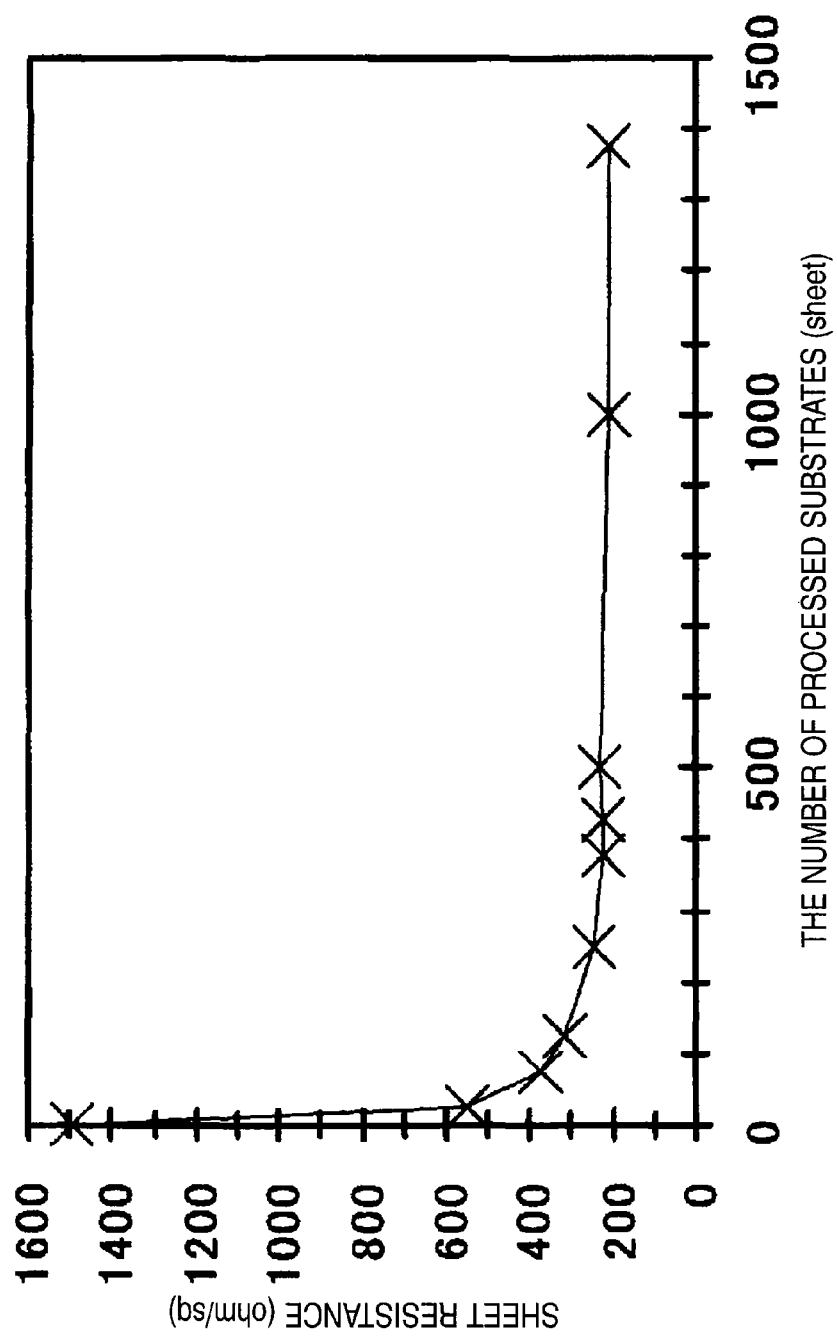
FIG. 6 is a diagram showing the relationship between the number of substrates subjected to plasma doping and sheet resistance.

As a result, as shown in FIG. 6, in the PD treatment of the 375-th substrate and the later, sheet resistant is stabilized. The average value of sheet resistance of the 375-th substrate and later is 220 ohm/sq. In the first substrate and the 375-th substrate and later, the PD condition is not changed, and thus the dose from $B_2H_6$ gas plasma is not changed. The change occurs in the dose from the film. Table 2 shows the dose by factors. In the 375-th substrate and the later, the dose from the film occupies approximately 85% and the $B_2H_6$ gas plasma occupies approximately 15%. It can be seen that the dose from the film becomes a principal factor.

TABLE 2

|  | Sheet Resistance (ohm/sq) | Ratio of Dose | Dose from $B_2H_6$ Gas Plasma (Normalization with Dose of First Substrate) | Dose from Film Containing Boron (Normalization with Dose of First Substrate) |
| --- | --- | --- | --- | --- |
| First Substrate (Comparative Example) | 1493 | 1 | 1 | 0 |
| 375-th Substrate and Later (Example) | 220 | 6.8 | 1 | 5.8 |

Figure 7:
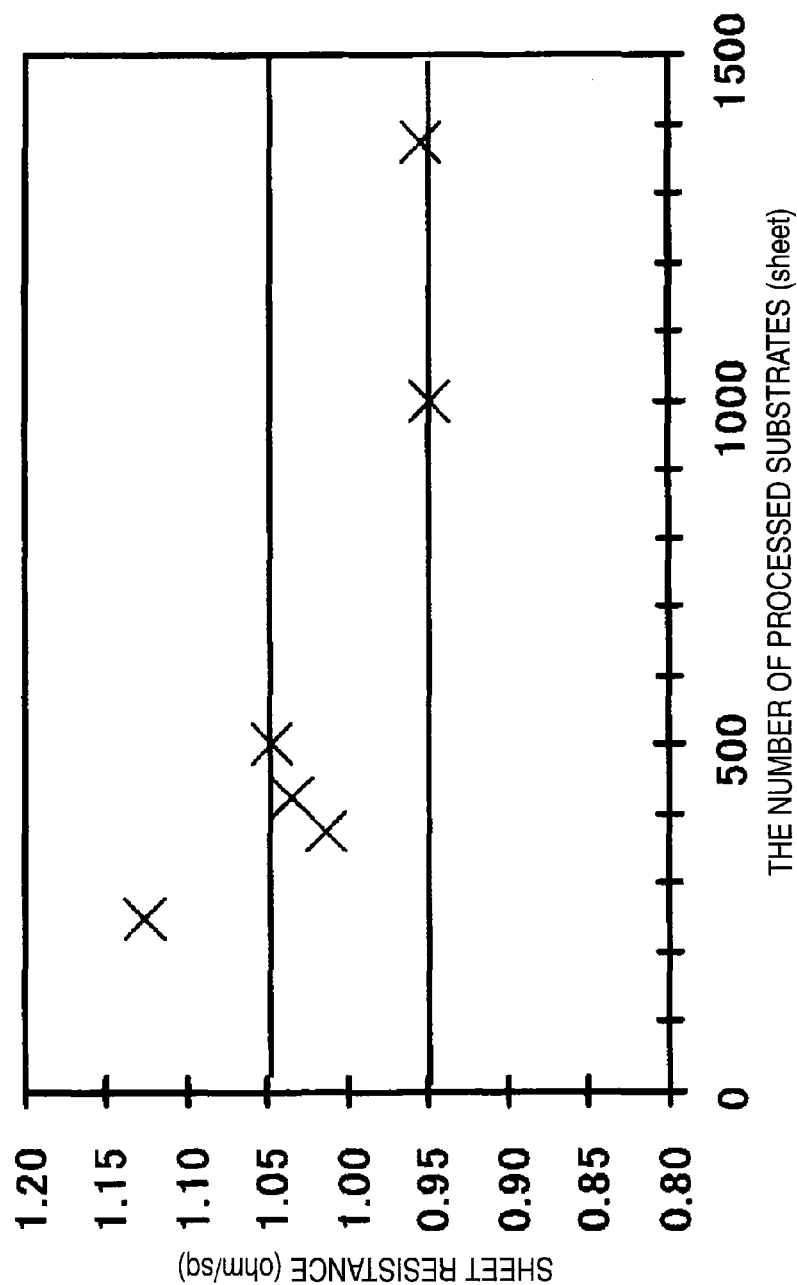
FIG. 7 is a diagram showing repetitive reproducibility of sheet resistance.

FIG. 7 is a diagram showing repetitive reproducibility of sheet resistance. Here, a ratio of sheet resistance ranging from 0.8 to 1.2 is shown. In the 375-th substrate and later, sheet resistance is converged on a variation within a tolerance ±5% from the average value, and a decrease of sheet resistance is saturated. That is, it can be understood that the formation of the film is saturated by the PD treatment around the 375-th substrate. After the formation of the film is completed, while sheet resistance varies around the average value within a small range, the PD treatment can be performed continuously many times.

Figure 8:
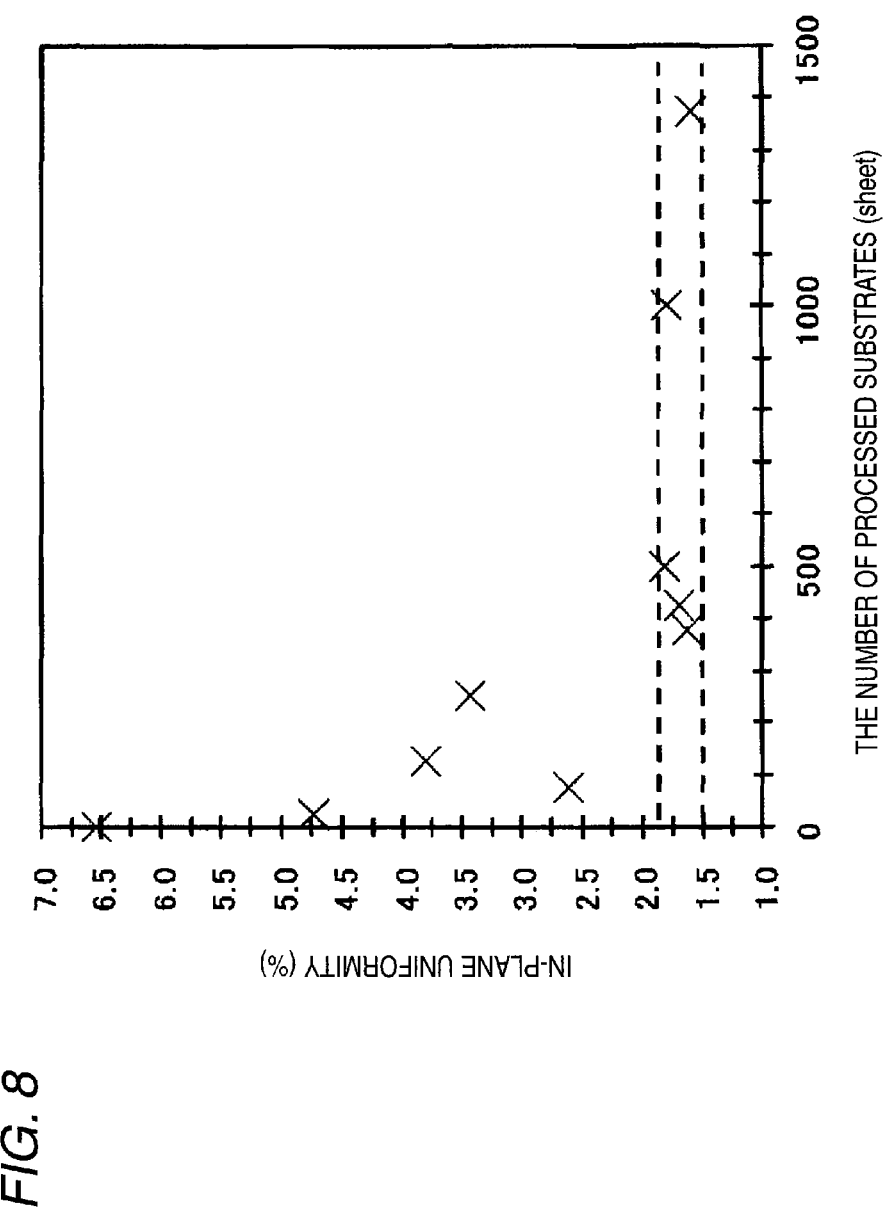
FIG. 8 is a diagram showing repetitive reproducibility of in-plane uniformity.

FIG. 8 is a diagram showing repetitive reproducibility of in-plane uniformity. In view of the in-plane uniformity when the formation of the film is completed, the gas supply method is adjusted immediately after the maintenance. As a result, in the PD treatment of the 375-th substrate and later when the formation of the film is completed, very good uniformity of 1.85% or less is obtained.

Figure 9:
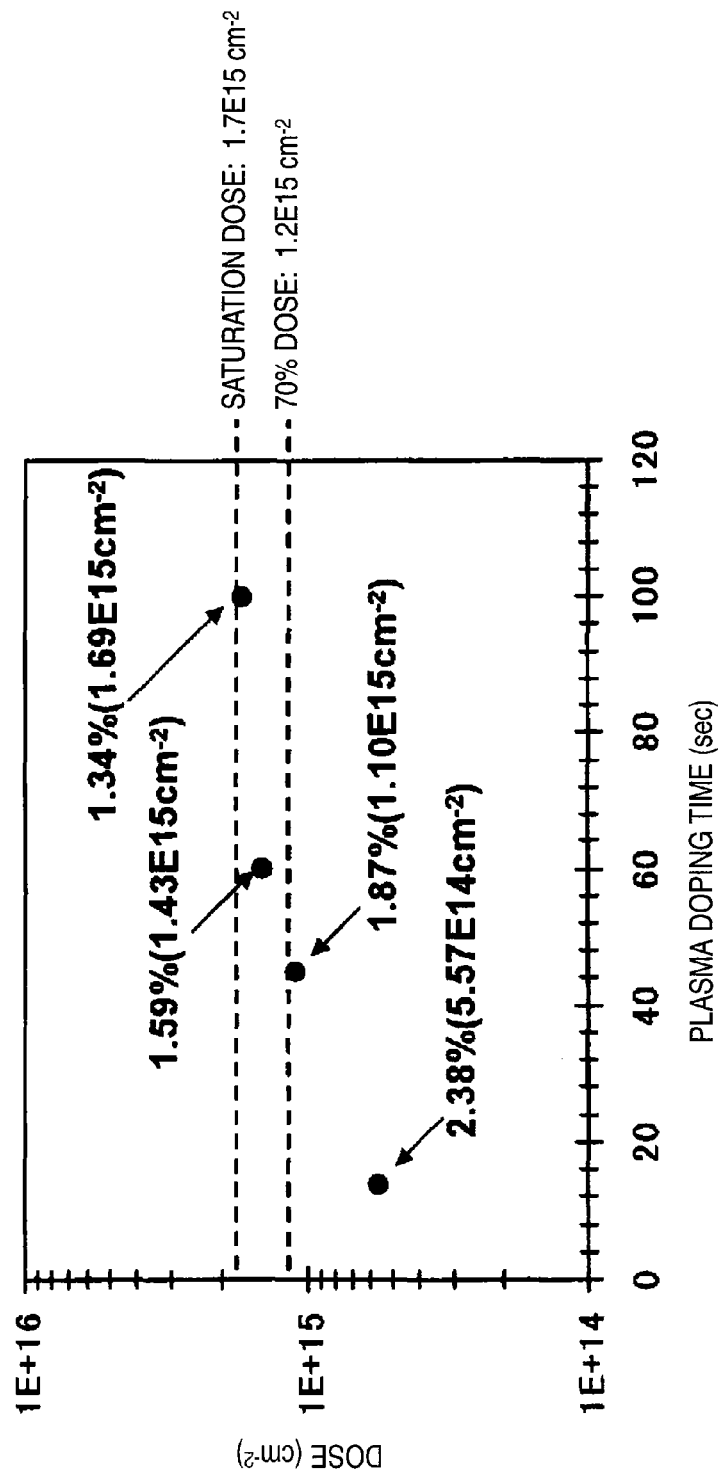
FIG. 9 is a diagram showing the relationship between a plasma doping time, and dose and in-plane uniformity.

Next, in the PD treatment from the 1350-th substrate to the 1353-th substrate, a change in in-plane uniformity when the PD time is changed is tested. The PD time means a time when a bias is applied by irradiating plasma. The PD time is changed to 14 seconds, 45 seconds, and 100 seconds. Moreover, in a continuous treatment before the 1350-th substrate and after the 1354-th substrate, the PD time is 60 seconds. Then, as data of the treatment for 60 seconds, data for the treatment of the 1375-th substrate closest to the 1350-th substrate is referred to. FIG. 9 shows the relationship between the PD time and the dose. FIG. 9 also shows a change in in-plane uniformity. If plasma irradiation starts, the dose is initially increased, and then the dose is increased such that 1.7E15 cm$^{-2}$ becomes an asymptotic line. It is recognized that there is a time when the change of the dose is very small without depending on the time variation. Through a process window of the time, the dose can be accurately controlled. It is more preferable to set a time when the dose occupies 70% or more of the asymptotic line. Accordingly, the in-plane uniformity can be further improved. It is still more preferable to set a time when the dose is closer to the asymptotic line. Therefore, the optimum in-plane uniformity can be obtained. Actually, when the PD time is 100 seconds, the in-plane uniformity of 1.34% at 1σ can be realized, regardless of the same condition, excluding the shape of the chamber, the gas supply method, and the PD time.

Among the results, the distribution results of sheet resistance at 121 places excluding an end 3 mm of the 300 mm substrate are shown in FIGS. 11 to 14. FIGS. 11(a) to 11(c) are diagrams showing in-plane uniformity of the samples of the first substrate in the comparative example, the 1000-th substrate in the example, and the 1375-th substrate in the example, respectively. FIGS. 12(a) to 12(b) are diagrams showing in-plane uniformity of the samples of the first substrate and the 125-th substrate in the comparative example, respectively. FIGS. 13(a) to 13(c) are diagrams showing the results after 14 seconds in the comparative example, after 60 seconds in the example, and after 100 seconds in the example.

Figure 10:
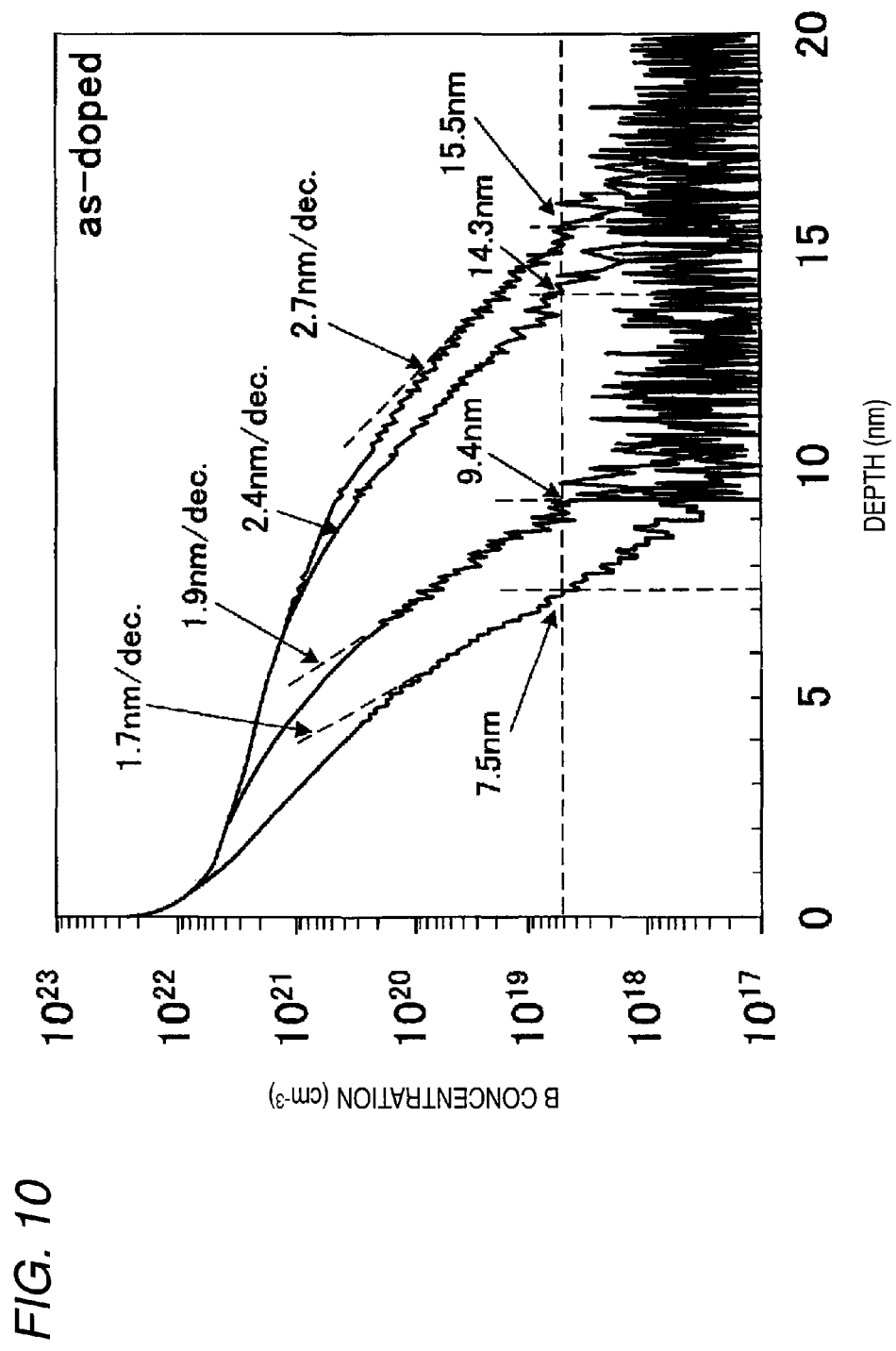
FIG. 10 is a diagram showing a SIMS profile of boron immediately after plasma doping.
Figure 11:
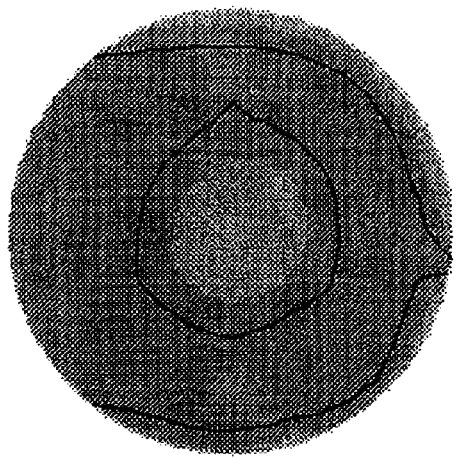
FIG. 11 is a diagram showing the comparison result between uniformity of a plasma doping region obtained by an example of the invention and uniformity of a plasma doping region obtained by a comparative example.
Figure 11:
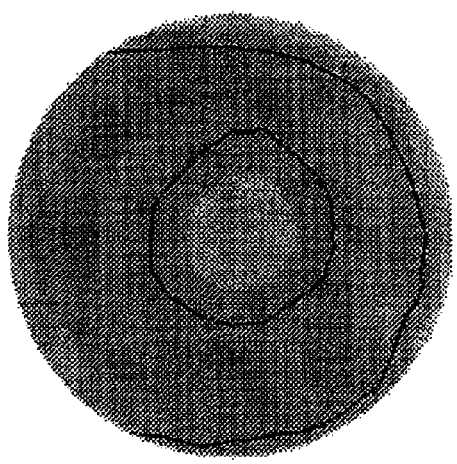
Figure 11:
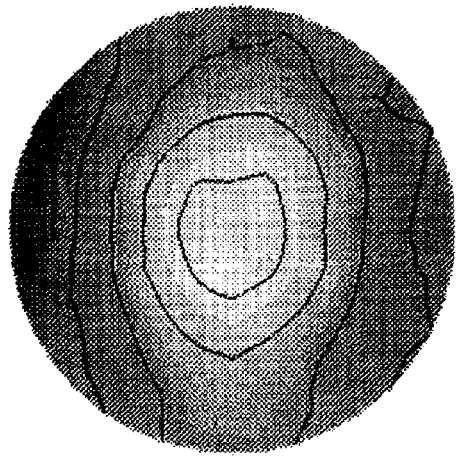
Figure 12:
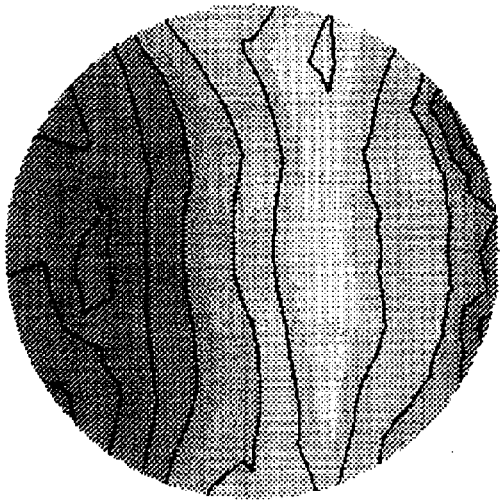
FIG. 12 is a diagram showing the comparison result between uniformity of a plasma doping region obtained by an example of the invention and uniformity of a plasma doping region obtained by a comparative example.
Figure 12:

As the SIMS analysis result of the silicon substrate immediately after the PD treatment, an implantation depth of boron is 9.4 nm (see FIG. 10). This means that implantation energy of boron is very low. Low energy corresponding to the implantation depth of 10 nm or less is widely industrially used in the related art. However, even in the ion implantation method capable of realizing excellent uniformity, it is not easy to realize uniformity of 2% or less over the entire surface excluding an end 3 mm of the 300 mm substrate. Further, in a plasma doping method that is known to have a difficulty in realizing uniformity, a degree of difficulty is still more severe. In contrast, according to the invention, when the implantation depth is 10 nm or less, uniformity of 2% or less can be realized over the entire surface excluding the end 3 mm of the 300 mm substrate at the implantation depth of 10 nm or less. In addition, when the PD time is adjusted, uniformity of 1.5% or less can be realized.

FIG. 10 shows a SIMS profile when a bias voltage in the plasma doping apparatus used in the invention is changed. The implantation depth of boron can be changed in a range of 7.5 nm to 15.5 nm. If an implantation energy range corresponds to at least the above-described implantation depth, the film containing boron can be formed on the inner wall of the vacuum chamber so as to saturate sheet resistance. Further, the shape of the inner wall of the vacuum chamber can be adjusted in advance such that the in-plane uniformity is improved when the formation of the film is completed. That is, through the same experiment, the fact that the method according to the invention can be used similarly and validity are confirmed.

Moreover, in the example, in order to form the film, the PD condition that is actually used after the film formation is repeated. However, the film may be formed a different condition from the PD condition to be actually used. Specifically, although the gas mixture ratios of $B_2H_6$ and He are 0.05% and 0.95% in the example, the gas mixture ratios may be 0.1% and 99.9%. It is preferable in that, if the $B_2H_6$ concentration is higher, the film can be formed in a short time. However, if the $B_2H_6$ concentration is increased to 5%, it is known that the film is not stabilized, and sheet resistance and in-plane uniformity are also unstable. It is preferable in that, if the $B_2H_6$ concentration is increased within a range in which a stable film can be formed, the film can be formed in a short time. After the film is formed in such a manner, from a practical viewpoint, it is preferable to adjust the $B_2H_6$ concentration such that the dose has a desired value, and immediately perform actual plasma doping. The optimum $B_2H_6$ concentration upon the film formation will be studied in future, but it belongs to a typical design item that still falls within the scope of the invention. In addition, while the film is formed, the dummy silicon substrate may be disposed on the sample electrode. After the formation of the film is completed, preferably, the dummy substrate is removed from the sample electrode, and then a substrate to be processed is placed and an actual treatment starts. Accordingly, an extra substrate for the formation of the film is not used. From this viewpoint, it is efficient.

Comparative Example 1

Comparative Example 1 will be described with reference to FIG. 4.

After the maintenance of the vacuum chamber, that is, after the film is removed, the plasma condition, the gas supply method, and the shape of the inner wall of the vacuum chamber are adjusted such that in-plane uniformity of the dose is improved. Here, a concept of the dose from the film is unconscious. This approach does not have the maintenance step of preparing the vacuum chamber having the film containing the impurity on the inner wall thereof such that, when the film containing the impurity fixed to the inner wall of the vacuum chamber is attacked by ions in plasma, the amount of the impurity to be doped into the surface of the sample by sputtering is not changed even though plasma containing the impurity ions is repeatedly generated in the vacuum chamber. A known approach that adopts in order to improve repeatability and in-plane uniformity with plasma doping almost corresponds to the above-described case.

As the result of trial and error under the same plasma condition and other different conditions, in-plane uniformity of 1.5% can be realized by the treatment of the first substrate. Sheet resistance is 455 ohm/sq. These are the results according to the known method. However, in a state where the in-plane uniformity of 1.5% is realized on the first substrate, the plasma doping treatment is repeatedly performed on 150 substrates under the same PD condition, and then the silicon substrate is examined. As the examination result, uniformity is 6.0%, and sheet resistance is 165 ohm/sq. It can be understood that repeatability of sheet resistance is not obtained. In general, the level of uniformity that is to be demanded for a practical use is 2% or less, and preferably, 1.5% or less. From this, in Comparative Example 1, even though the state where uniformity of 1.5% is obtained through the maintenance and condition adjustment is arranged, the maintenance is required again upon the treatment after 150 substrates.

In Comparative Example 1, in a state before the film is formed immediately after the maintenance, the shape of the inner wall of the vacuum chamber or the gas supply method is adjusted such that the in-plane uniformity is improved. However, in this method, the film containing boron is formed on the inner wall of the vacuum chamber by plasma doping, and the state is changed. Accordingly, good in-plane uniformity cannot be repeatedly and stably obtained, and the same sheet resistance cannot be repeatedly obtained. In contrast, in the example, there is provided the maintenance step that prepares the vacuum chamber having the film containing the impurity on the inner wall such that the dose from the film is not changed even though the plasma is repeatedly generated. Then, in a state after the film containing boron is stably formed on the inner wall of the vacuum chamber, the shape of the inner wall of the vacuum chamber or the gas supply method is adjusted. With this difference, in the example, the following marked effects can be obtained. That is, even though production is repeated for a long time, in-plane uniformity can be kept to a stable and good level. Further, sheet resistance is stabilized and thus the same sheet resistance can be obtained.

Comparative Example 2

As Comparative Example 2, not immediately after the maintenance, when the film is being formed, which is not intended for convenience of the experiment, the gas supply method and the shape of the inner wall of the vacuum chamber may be adjusted such that the in-plane uniformity is improved. An experiment of repeatability of sheet resistance may start. Typically, when gas plasma containing an impurity is used for plasma doping, for example, when mixture gas plasma of $B_2H_6$ and He is used, a film is naturally formed even though an experimenter does not intend to form the film. Comparative Example 2 corresponds to a case where an experimenter who makes an experiment on a depth control of an impurity upon plasma doping starts an experiment on in-plane uniformity or repeatability without performing the maintenance of the vacuum chamber for convenience for the experiment. However, even though plasma is repeatedly generated in the vacuum chamber, the formation of the film is incomplete. Further, the maintenance step that prepares the vacuum chamber having the film containing the impurity on the inner wall such that the dose from the film is not changed is not provided. This is because the formation of the film is incomplete. In this case, repeatability of sheet resistance is not obtained because of the same reason as Comparative Example 1.

Comparative Example 3

In Comparative Example 2, there may be a case where the formation of the film is unintentionally completed. However, it is difficult to increase repetitive stability of sheet resistance and in-plane uniformity to a reliable level. When it is against the intention of the invention, in particular, it is very difficult to increase repeatability of in-plane uniformity.

The reason will be described. In a general plasma doping apparatus, after the film is formed, it is difficult to adjust the shape of the inner wall of the vacuum chamber and the gas supply method. As for the adjustment of the gas supply method, specifically, a position where the gas is supplied to the vacuum chamber may be adjusted. In order to change the shape of the inner wall of the vacuum chamber, a part of the inner wall needs to have mechanical drivability.

However, if a complex mechanical movement to change the shape of the inner wall is performed in the vacuum chamber, particles are likely to be generated. The mechanical movement needs to be as small as possible. If the inner wall corresponding to a portion where the film is formed is moved, a part of the film is separated, which results in particles. When the position where the gas is supplied to the vacuum chamber is changed, a mechanical movement for changing the position of the gas outlet port occurs. For this reason, the particles are generated for the same reason.

Meanwhile, it may be considered that the shape of the inner wall of the vacuum chamber and the gas supply method are adjusted by exposing the vacuum chamber to atmosphere, with no mechanical movement. However, in this case, it is not preferable in that the generation frequency of the particles clearly becomes high compared with a case where production can be performed with no exposure to atmosphere after the formation of the film. In addition, in the case of the film containing boron, it is particularly difficult. From the experiment result, it is known that the film containing boron is likely to act with moisture. For this reason, upon the exposure to atmosphere, the film acts with moisture in atmosphere, the quality of the film is changed. Accordingly, even though the vacuum chamber is vacuumized and the adjustment is performed for plasma doping, performance of the film before the exposure to atmosphere is not obtained. Accordingly, in the case of the film containing boron, it is impossible to adjust the shape of the inner wall of the vacuum chamber and the gas supply method by exposing the vacuum chamber to atmosphere after the film is formed.

In Comparative Example 2, the shape of the inner wall of the vacuum chamber or the gas supply method is adjusted such that repeatability and in-plane uniformity are improved after the film is unintentionally formed. However, in this method, when the film is being formed, repeatability is not obtained. In addition, when the formation of the film is completed, it is difficult to improve in-plane uniformity. In contrast, in the example, in a state where the film containing boron is stably formed on the inner wall of the vacuum chamber, the shape of the inner wall of the vacuum chamber or the gas supply method is adjusted in advance such that in-plane uniformity is improved. With this difference, in the example, the following marked effects can be obtained. That is, in-plane uniformity and repeatability can be stably kept to a good level without causing the particles.

When the film contains boron, the vacuum chamber cannot be exposed to atmosphere. Accordingly, in the comparative example, it is more difficult to adjust in-plane uniformity. Therefore, the effects of the example more markedly exhibit. As such, like the example, it is preferable to adjust the shape of the inner wall of the vacuum chamber and the gas supply method in advance before the film is formed such that in-plane uniformity is improved after the film is formed.

Comparative Example 4

There is disclosed a technology that causes sputtering gas to collide against a solid target containing an impurity in a plasma state so as to fly the impurity out of the target, and dopes the flown impurity into the surface of the sample (Patent Document 3). In the technology disclosed in Patent Document 3, a microwave of 1 GHz or more is introduced into a vacuum chamber. In a known sputtering apparatus, a material forming the target is a metal. Accordingly, in a parallel flat-plate type plasma generation device not having a plasma generation unit, such as ECR or the like, plasma is also generated.

However, when a target containing boron is used, since boron has high insulation, a generated electric field is diffused, and thus plasma is rarely generated. Then, ECR18 is provided so as to introduce a microwave of 1 GHz or more into the vacuum chamber. As such, if the microwave of 1 GHz or more is introduced into the vacuum chamber, high-density plasma of 1000 times as much as plasma in the parallel flat-plate type plasma generation device is generated. Accordingly, the impurity, such as boron or the like, can be implanted into the surface of the silicon substrate in a short time. For this reason, the temperature of the silicon substrate is not increased to 300° C. or more, and thus it is possible to prevent a resist pattern formed on the silicon substrate from being burned.

In this method, the solid target containing the impurity is prepared and placed in the vacuum chamber. However, in this comparative example, the maintenance that forms the film containing the impurity such that the amount of an impurity to be doped into the surface of the sample by sputtering is not changed even though the plasma containing the impurity ions is repeatedly generated in the vacuum chamber is not performed. Accordingly, it is difficult to obtain in-plane uniformity or repeatability. The reason will be described. Even though the solid target is disposed in the vacuum chamber, if the plasma containing the impurity used in the example (boron in the example) is repeatedly excited in the vacuum chamber, a film containing boron is being formed in the surface of the solid target. Further, the film containing boron is formed on the surface of the inner wall at a portion of the inner wall of the vacuum chamber that is not covered with the solid target. Then, repetitive excitation is performed, and the formation of the film is saturated and completed after the excitation for a certain time. Accordingly, only by disposing the solid target in the vacuum chamber, the maintenance step that prepares the vacuum chamber having the film containing the impurity on the inner wall such that dose from the film is not changed even though the plasma is repeatedly generated in the vacuum chamber is not provided. As a result, it is difficult to obtain repeatability of sheet resistance.

Further, although a method of creating a target is not clearly described, in general, it is considered that the target is not created in the vacuum chamber, and the externally created target is provided in the vacuum chamber. However, in this method, a solid containing an impurity is necessarily exposed to atmosphere one time. Accordingly, the solid may act with oxygen in atmosphere, and an oxide film may be formed in the surface of the film. Further, the solid may act with moisture in atmosphere, and the quality of the film may be changed. The oxidization of the film or the action with moisture in atmosphere has a large affect on the dose of the impurity after plasma doping and uniformity. Therefore, even though the shape of the solid target containing the impurity or the installment place thereof is designed such that in-plane uniformity is temporarily improved, uniform plasma doping cannot be performed as design due to a change in atmospheric humidity or temperature. For the same reason, repetitive reproducibility of the dose is not obtained. Moreover, in a clean room in which humidity or temperature is managed, humidity and temperature change a little every day, and thus it is impossible to suppress oxidization or action with moisture.

In contrast, in the invention, the film containing the impurity is formed on the inner wall such that the dose from the film containing the impurity fixed to the inner wall of the vacuum chamber is not changed even though the plasma is repeatedly generated. Accordingly, the marked effects, for example, repetitive reproduction of the dose, can be obtained. Further, in the invention, the film containing the impurity fixed to the inner wall of the vacuum chamber is formed such that, when a dose of the impurity is the same level with a tolerance of ±10% even though the plasma containing the impurity ions is repeatedly generated in the vacuum chamber, the dose is made uniform in a surface of the silicon substrate. Accordingly, while good in-plane uniformity of the dose is kept, repetitive reproducibility can be obtained. In addition, in the invention, the step of forming the film containing the impurity is performed by providing the vacuum chamber, from which the film containing the impurity is removed in the maintenance step, in the plasma doping apparatus and generating the plasma containing the impurity ions in the vacuum chamber. Accordingly, the film containing the impurity can be used for plasma doping with no exposure to atmosphere. Therefore, there is no affect of atmospheric humidity or temperature, and repetitive reproducibility can be secured over the entire surface of the 300 mm substrate excluding the end 3 mm. In addition, very uniform plasma doping of the impurity can be performed with the standard deviation of 1.7%, and, if the PD time is adjusted, 1.5% or less.

TABLE 3

|  | Exposure to Atmosphere of Film (solid) Containing Impurity | Repetitive Stability of Dose When PD is Repeated | Repetitive Stability of In-Plane Uniformity When PD is Repeated |
| --- | --- | --- | --- |
| Example | No | ◉ | ◉ |
| Comparative Example 1 | No | X | X |
| Comparative Example 2 | No | Δ | X |
| Comparative Example 4 | Exposure | X | X |

(Example) A case where, before the film is formed, the shape of the inner wall of the vacuum chamber and the gas supply method are adjusted in advance such that in-plane uniformity is improved after the film is formed (Comparative Example 1) A case where, before the film is formed, the plasma condition, the gas supply method, and the shape of the inner wall of the vacuum chamber are adjusted such that in-plane uniformity of the dose is improved (Comparative Example 2 (3)) A case where, when the film is unintentionally being formed, the gas supply method and the shape of the inner wall of the vacuum chamber are adjusted such that in-plane uniformity of the dose is improved (Comparative Example 4) A technology that causes the sputtering gas to collide against the solid target containing the impurity in a plasma state so as to fly the impurity out of the target, and dopes the flown impurity into the surface of the sample Plasma doping has attracted attention for 20 years since a group including one of the inventors had stated an impurity implantation method to a silicon trench in 1986 to 1987 (Non-Patent Document 3). Thereafter, in a technical field for forming a shallow junction, a MOS device fabricated using plasma doping had stated in 1996 (Non Patent Documents 4 and 5). For 10 years since then, plasma doping has attracted attention and would be expected to be put to practical use. However, plasma doping has been yet far from practical use. One of the problems as the obstruction to practical use was repetitive stability of the dose and in-plane uniformity. The invention is to solve this problem.

In the case of Comparative Examples 1, 2, and 3, even though the design items are arranged through the combination thereof, sufficient repetitive stability of the dose and in-plane uniformity when plasma doping is repeated is not obtained. Meanwhile, in the example, repetitive stability of the dose and in-plane uniformity is obtained. A resolution method of repetitive stability of the dose and in-plane uniformity described herein is not easily made through the combination of the comparative examples and also not the design items of the apparatus technology. This method is an unprecedented method and has marked effects.

According to the plasma doping method of the invention, it is possible to realize a plasma doping method that can control an impurity concentration profile with high accuracy and can form a shallow impurity diffusion region. In addition, the plasma doping method of the invention can be applied to the use, such as an impurity doping process of a semiconductor or manufacturing of a thin film transistor used in liquid crystal or the like.

The invention claimed is:

1. A plasma doping method for forming an impurity doped layer in a substrate to be processed, the plasma doping method comprising:
   a step (a) of preparing a vacuum chamber having an inner wall on which a film containing a first impurity is formed;
   a step (b) of, after the step (a), placing the substrate to be processed on a sample table; and
   a step (c) of, after the step (b), generating plasma including a second impurity in the vacuum chamber and supplying high-frequency power to an electrode having the sample table so as to dope the first impurity and the second impurity into the substrate to be processed and to form the impurity doped layer,
   wherein the inner wall surrounds the sample table on which the substrate to be processed is placed.

2. The plasma doping method according to claim 1, wherein, in the step (c), a dose of the first impurity to be doped into the impurity doped layer is larger than a dose of the second impurity.

3. The plasma doping method according to claim 1, wherein, in the step (c), the second impurity is doped into the substrate to be processed by irradiating the plasma containing the second impurity, and the first impurity to be sputtered and emitted when the film containing the first impurity is exposed to the plasma is doped into the substrate to be processed.

4. The plasma doping method according to claim 1, wherein the first impurity and the second impurity are the same impurity.

5. The plasma doping method according to claim 1,
   wherein the substrate is a semiconductor substrate; and
   in the step (a), the film containing the first impurity is set such that the total distribution of the distribution of the second impurity to be doped from the plasma containing the second impurity and the distribution of the first impurity to be doped from the film containing the first impurity is made uniform in a surface of the semiconductor substrate.

6. The plasma doping method according to claim 1, wherein the inner wall is an inner wall of the vacuum chamber.

7. The plasma doping method according to claim 1, wherein the formation of the impurity doped layer is performed using a plasma doping apparatus having the sample table, and
the step (a) includes a substep of providing the vacuum chamber, from which the film containing the first impurity is removed, in the plasma doping apparatus and then generating plasma containing the first impurity in the vacuum chamber so as to form the film containing the first impurity on the inner wall of the vacuum chamber.

8. The plasma doping method according to claim 1,
wherein the formation of the impurity doped layer is performed using a plasma doping apparatus having the sample table, and
the step (a) includes:
a step (a1) of providing the vacuum chamber, from which the film containing the first impurity is removed, in a plasma doping apparatus different from the plasma doping apparatus and then generating plasma containing the first impurity ions in the vacuum chamber so as to form the film containing the first impurity on the inner wall of the vacuum chamber; and
a step (a2) of, after the step (a1), providing the vacuum chamber having the film containing the first impurity on the inner wall in the plasma doping apparatus.

9. The plasma doping method according to claim 1,
wherein the inner wall is an inner wall of an inner chamber provided in the vacuum chamber.

10. The plasma doping method according to claim 1,
wherein the formation of the impurity doped layer is performed using a plasma doping apparatus that is provided with a head plate having a plurality of gas outlet ports at a position facing the substrate to be processed placed on the sample table.

11. The plasma doping method according to claim 1,
wherein the plasma containing the second impurity is plasma of gas containing boron.

12. The plasma doping method according to claim 11,
wherein the gas containing boron is gas having boron and hydrogen molecules.

13. The plasma doping method according to claim 11,
wherein the gas containing boron is diborane ($B_2H_6$).

14. The plasma doping method according to claim 1,
wherein the plasma containing the second impurity is plasma of gas that is obtained by diluting gas having boron and hydrogen molecules with rare gas.

15. The plasma doping method according to claim 14,
wherein the rare gas is an atom having an atomic weight equal to or less than neon.

16. The plasma doping method according to claim 14,
wherein the rare gas is helium.

17. The plasma doping method according to claim 1,
wherein the plasma containing the second impurity is plasma of gas that is obtained by diluting diborane ($B_2H_6$) with helium.

18. The plasma doping method according to claim 11,
wherein an implantation depth of boron is in a range of 7.5 nm to 15.5 nm.

19. The plasma doping method according to claim 1,
wherein, in the step (c), a temperature of the inner wall of the vacuum chamber is set to a desired temperature in a range of 40° C. to 90° C.

* * * * *